United States Patent
Choi et al.

(10) Patent No.: US 11,482,463 B2
(45) Date of Patent: Oct. 25, 2022

(54) VERTICALLY ATTACHING A CHIP TO A SUBSTRATE

(71) Applicant: JMJ Korea Co., Ltd., Bucheon-si (KR)

(72) Inventors: Yun Hwa Choi, Bucheon-si (KR); Jeonghun Cho, Goyang-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 297 days.

(21) Appl. No.: 16/879,738

(22) Filed: May 20, 2020

(65) Prior Publication Data

US 2020/0395264 A1 Dec. 17, 2020

(30) Foreign Application Priority Data

Jun. 14, 2019 (KR) .......... 10-2019-0070583
Mar. 19, 2020 (KR) .......... 10-2020-0033834

(51) Int. Cl.
| | | |
|---|---|---|
| H01L 23/495 | (2006.01) | |
| H01L 23/34 | (2006.01) | |
| H01L 23/48 | (2006.01) | |
| H01L 21/00 | (2006.01) | |
| H05K 7/20 | (2006.01) | |

(Continued)

(52) U.S. Cl.
CPC ........ *H01L 23/367* (2013.01); *H01L 23/4952* (2013.01); *H01L 23/49568* (2013.01); *H01L 23/49811* (2013.01); *H01L 24/14* (2013.01); *H01L 25/0657* (2013.01); *H01L 29/7395* (2013.01)

(58) Field of Classification Search
CPC ............ H01L 29/7395; H01L 23/4952; H01L 23/49568; H01L 24/48; H01L 24/45; H01L 24/49; H01L 25/0567; H01L 25/0657; H01L 23/49811
See application file for complete search history.

(56) References Cited

U.S. PATENT DOCUMENTS

| | | | |
|---|---|---|---|
| 6,437,435 B1 * | 8/2002 | Kinsman ................ | H05K 3/301 439/91 |
| 2012/0211878 A1 * | 8/2012 | Popovic .............. | H01L 25/0657 438/109 |

(Continued)

FOREIGN PATENT DOCUMENTS

| | | |
|---|---|---|
| JP | H07-202120 A | 8/1995 |
| JP | 2002-093988 A | 3/2002 |

(Continued)

*Primary Examiner* — Alonzo Chambliss
(74) *Attorney, Agent, or Firm* — Park, Kim & Suh, LLC

(57) ABSTRACT

Provided is a semiconductor package modularized and manufactured by preparing a main block for putting on a semiconductor chip, an insulator, and one or more sub block, preparing the semiconductor chip, preparing an adhesive used in attaching the semiconductor chip, attaching the semiconductor chip to an upper surface or upper and lower surfaces of the main block, performing an electrical connection of the semiconductor chip, preparing a substrate comprising a pattern enabling an electrical connection and vertically attaching one side of the main block to the pattern of the substrate to enable an electrical connection. In the semiconductor package above, an accumulation rate increases on the substrate due to a vertically arranged structure of the semiconductor chips and a heat emission area is enlarged to improve a heat emission effect.

18 Claims, 24 Drawing Sheets

(51) Int. Cl.
    *H05K 1/14*           (2006.01)
    *H05K 5/00*           (2006.01)
    *H01L 23/367*       (2006.01)
    *H01L 23/00*        (2006.01)
    *H01L 25/065*       (2006.01)
    *H01L 23/498*       (2006.01)
    *H01L 29/739*       (2006.01)

(56) References Cited

U.S. PATENT DOCUMENTS

| | | | | |
|---|---|---|---|---|
| 2013/0322081 | A1* | 12/2013 | Pan | H01L 33/505 |
| | | | | 362/249.02 |
| 2014/0153239 | A1* | 6/2014 | Pu | H01L 33/508 |
| | | | | 362/237 |
| 2016/0013372 | A1* | 1/2016 | Lee | H01L 33/62 |
| | | | | 257/98 |

FOREIGN PATENT DOCUMENTS

| | | |
|---|---|---|
| JP | 2012-004543 A | 1/2012 |
| KR | 10-1995-0005450 B1 | 5/1995 |
| KR | 10-2003-0087643 A | 11/2003 |
| KR | 10-2014-0040406 A | 4/2014 |
| KR | 10-2016-0109573 A | 9/2016 |
| KR | 10-1694657 B1 | 1/2017 |
| KR | 10-1899788 B1 | 11/2018 |
| KR | 10-1920915 B1 | 11/2018 |

* cited by examiner power block as a unit

VERTICALLY ATTACHING A CHIP TO A SUBSTRATE

CROSS-REFERENCE TO RELATED PATENT APPLICATION

This application claims the benefit of Korean Patent Application No. 10-2019-0070583, filed on Jun. 14, 2019, and Korean Patent Application No. 10-2020-0033834, filed on Mar. 19, 2020 in the Korean Intellectual Property Office, the disclosure of which is incorporated herein in its entirety by reference.

BACKGROUND OF THE INVENTION

1. Field of the Invention

The present invention relates to a semiconductor package, and more particularly, to a semiconductor package to increase an accumulation rate on a substrate by using a vertically arranged structure of a semiconductor chip and to improve a heat emission effect by enlarging a heat emission area.

In addition, the present invention relates to a semiconductor package to improve an accumulation rate of a semiconductor chip by using a vertically attached structure of the semiconductor chip through a main block on a substrate.

2. Description of the Related Art

In general, a semiconductor package includes a semiconductor chip 20 on a substrate 10 within a semiconductor package body 60, and the semiconductor chip 20 is connected to the substrate 10 by using a metal clip 31 or a conductive wire 32, as illustrated in FIG. 1A.

Also, as illustrated in FIG. 1B, in a semiconductor package, the semiconductor chip 20 is installed on a lower substrate 10B having a direct boded copper (DBC) structure, wherein the structure includes a pattern metal layer B, an insulation layer C, and a pattern metal layer D stacked in order within a semiconductor package body. The semiconductor chip 20 is connected to the pattern metal layer B of the lower substrate 10B through the conductive wire 32 and is attached to an upper substrate 10A having the DBC structure, where the pattern metal layer B, the insulation layer C, and the pattern metal layer D are stacked in order, through a metal post 40.

In addition, the semiconductor chip 20 is formed to be installed on the substrates 10, 10A, and 10B in a horizontal direction and heat emission is not smoothly accomplished due to a horizontal structure of the metal clip 31 or the conductive wire 32. Accordingly, in order to reduce heat generated from the semiconductor chip 20, a separate heat slug is needed to emit the heat.

In this regard, a packaging technology through which a horizontal installation structure of a semiconductor chip may be basically improved, a size of a semiconductor package may be minimized, a separate heat emission structure may not be added, heat generated from a semiconductor chip may be efficiently reduced and thereby, a yield may be increased is required.

SUMMARY OF THE INVENTION

The present invention provides a semiconductor package to increase an accumulation rate on a substrate by using a vertically arranged structure of a semiconductor chip and to improve a heat emission effect by enlarging a heat emission area.

The present invention also provides a semiconductor package including a cooling pipe passing through a block so as to increase an accumulation rate on a substrate by using a vertically arranged structure of a semiconductor chip, to improve a heat emission effect by enlarging a heat emission area, and to reduce heat generated from a semiconductor chip by circulating a coolant.

The present invention also provides a semiconductor package in which semiconductor chips are vertically arranged between an upper substrate and a lower substrate, a heat emission area is enlarged, and thus, a cooling effect is improved.

The present invention also provides a compact semiconductor package by directly and electrically connecting a semiconductor chip attached to a main block to an external terminal.

According to an aspect of the present invention, there is provided a semiconductor package which is modularized and manufactured by methods including: preparing a main block for putting on a semiconductor chip, an insulator, and one or more sub block; preparing the semiconductor chip; preparing an adhesive used in attaching the semiconductor chip; attaching the semiconductor chip to an upper surface or upper and lower surfaces of the main block; performing an electrical connection of the semiconductor chip; preparing a substrate comprising a pattern enabling an electrical connection; and vertically attaching one side of the main block to the pattern of the substrate to enable an electrical connection.

Here, the main block and the sub block may include a conductive metal.

The adhesive may include a solder base or a sintering material such as Ag or Cu.

The main block may include at least one or more semiconductor chips attached on an upper surface or upper and lower surfaces thereof.

The semiconductor chips may be in plural numbers and may be electrically connected to each other by using a metal clip, and the semiconductor chips and the sub block may be electrically connected to each other by using a conductive wire The substrate may be formed of an insulating material and a metal pattern formed on the insulating material One side of the main block may be vertically attached to the pattern of the substrate by using ultrasonic welding, soldering or sintering and may be electrically connected to the pattern of the substrate.

The semiconductor chips may include a power diode and a power DVC, the power diode and the power DVC may be electrically connected to each other by using the metal clip, the power diode and the sub block may be electrically connected to each other by using a conductive wire or a conductive metal so as to form a power block as a unit, and a group block including a first power block, a second power block, and a spacer block may be vertically attached and electrically connected to the pattern of the substrate.

The sub block of the group block may be electrically connected to the substrate by using a conductive wire or a conductive metal.

The group block and the substrate may be further formed on a semiconductor package body, a terminal pin may be formed to connect a conductive wire connected to the substrate, the terminal pin may be vertically formed on the substrate or inserted into the semiconductor package body, and the terminal pin may be electrically connected to the substrate by using a conductive wire or a conductive metal.

The semiconductor package may further include another substrate electrically connected to the other side of the main block.

The substrate and the other substrate may be formed by stacking one or more metal layers, an insulation layer, and one or more metal layers in order or by stacking one or more metal layers and the insulation layer in order.

The substrate and the other substrate may be formed as a single metal layer having a thickness of 0.1 mm through 10 mm.

The semiconductor package may further include a cooling pipe extending from the outside of the semiconductor package body to a hole of the spacer block so that a coolant circulates therethrough.

A semiconductor package may further include a cooling pipe extending from the outside of the semiconductor package body to a hole of the spacer block so that a coolant circulates therethrough.

According to another aspect of the present invention, there is provided a semiconductor package including: a main block; one or more semiconductor chips attached to one side of the main block; a first pattern substrate comprising a pattern enabling an electrical connection; and a package body surrounding the main block and the semiconductor chips, wherein the other side of the main block may be vertically attached and electrically connected to the first pattern substrate.

One or more semiconductor chips may be attached on an upper surface of the main block, and a lower surface or a side of the main block may be vertically attached and electrically connected to the first pattern substrate.

The semiconductor chips and the first pattern substrate may be directly connected to each other by using an electrical connecting member or electrically connected to each other by using a conductive medium interposed therebetween.

The semiconductor package may further include a second pattern substrate including a pattern enabling an electrical connection, wherein one or more semiconductor chips may be attached on the upper surface of the main block, and the upper side surface and the lower side surface of the main block may be vertically attached and electrically connected to the first pattern substrate and the second pattern substrate, respectively.

The main block may include a first main block and a second main block, wherein a lower side surface of the first main block is attached to the first pattern substrate and an upper side surface of the second main block is attached to the second pattern substrate, the first main block and the second main block may have different vertical heights, and the first main block, the second main block, and a spacer interposed between the first main block and the second main block may be arranged in series between the first pattern substrate and the second pattern substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
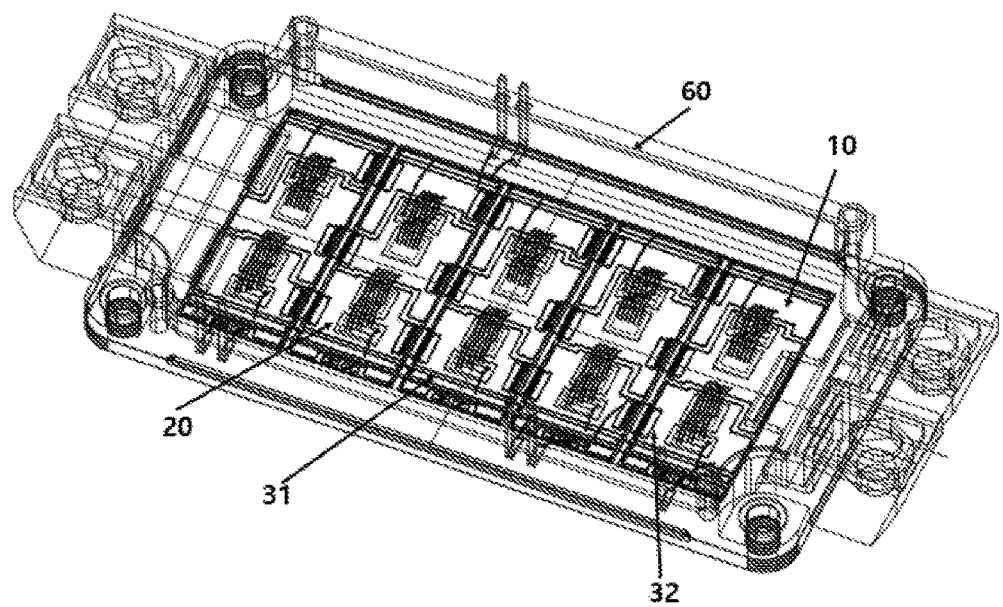
FIGS. 1A and 1B are conventional wire connection module packages.
Figure 1B:
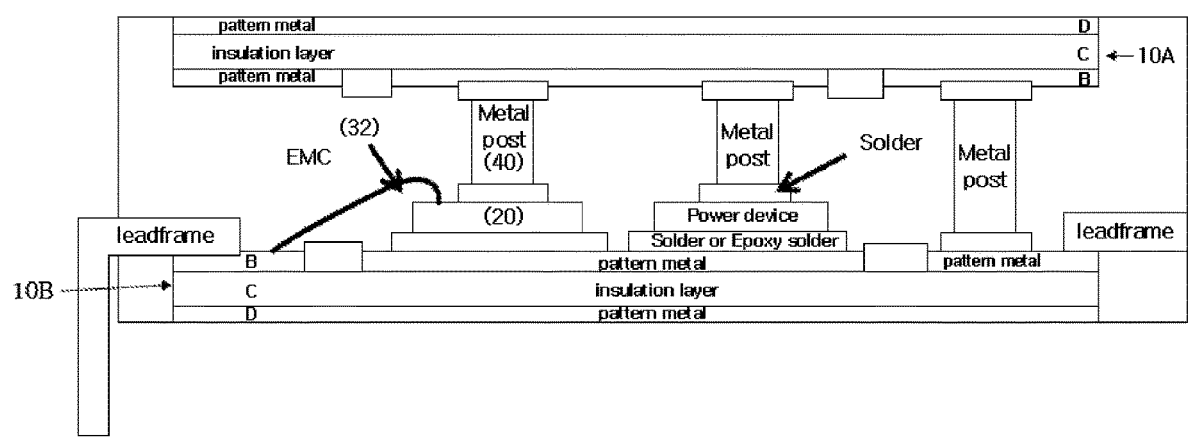
Figure 2A:
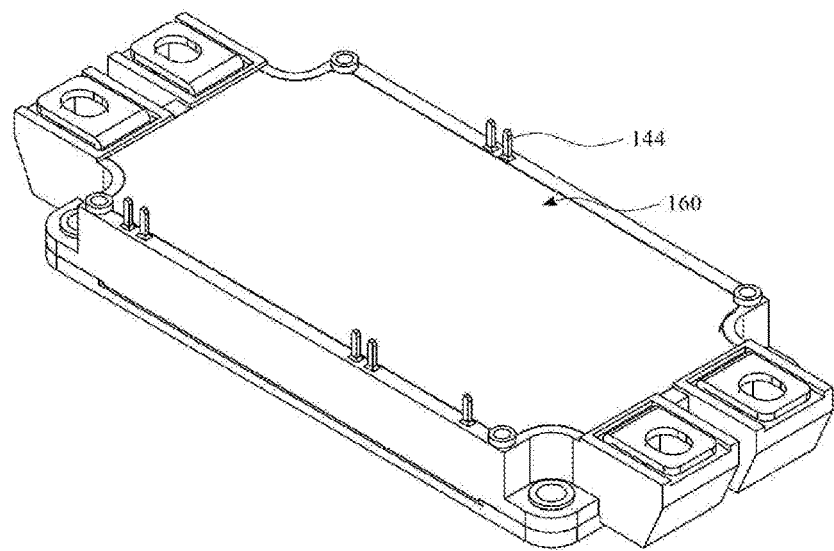
FIGS. 2A and 2B are perspective views of a semiconductor package according to an embodiment of the present invention.
Figure 2B:
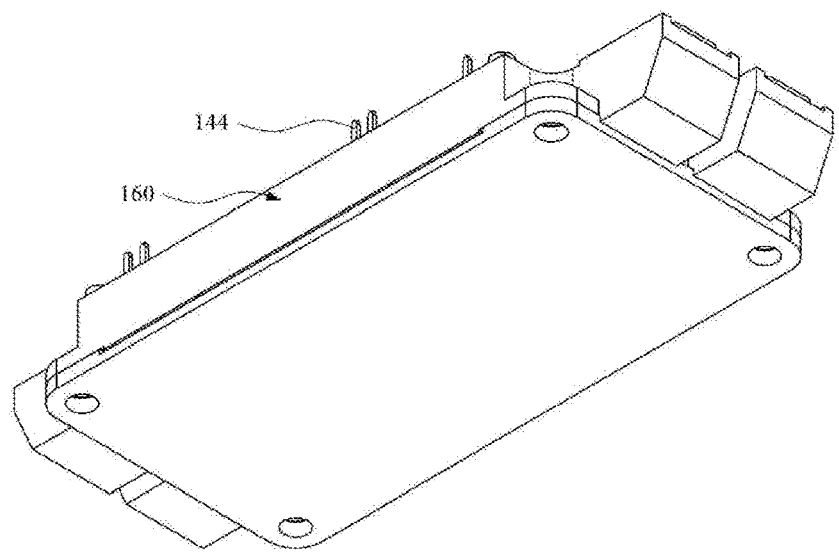

Hereinafter, embodiments of the present invention will be described more fully with reference to the accompanying drawings so that this disclosure will fully convey the concept of the invention to those skilled in the art. The present invention may be embodied in many different forms and should not be construed as being limited to the embodiments set forth herein.

Referring to FIGS. 2A through 7, a semiconductor package according to an embodiment of the present invention is modularized and manufactured by preparing a main block 110 for putting on a semiconductor chip 111, an insulator 120, and a sub block 130, preparing the semiconductor chip 111, preparing an adhesive (not illustrated) used in attaching the semiconductor chip 111, attaching the semiconductor chip 111 to an upper surface or upper and lower surfaces of the main block 110, performing an electrical connection of the semiconductor chip 111, preparing a substrate 140 including a pattern 141 enabling an electrical connection, vertically attaching one side of the main block 110 to the pattern 141 of the substrate 140, and enabling an electrical connection. Accordingly, an accumulation rate increases on the substrate 140 due to a vertically arranged structure of the semiconductor chip 111 and a heat emission area is enlarged to improve a heat emission effect.

Figure 5A:
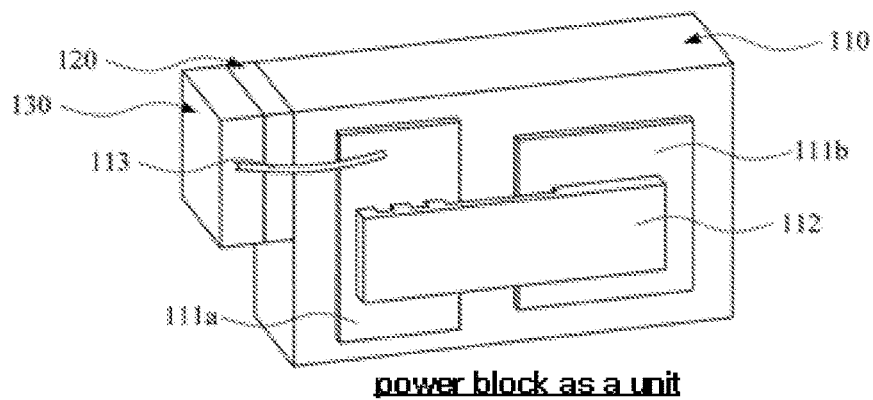
FIGS. 5A and 5B illustrate group blocks separated from the semiconductor package of FIGS. 2A and 2B.
Figure 5B:
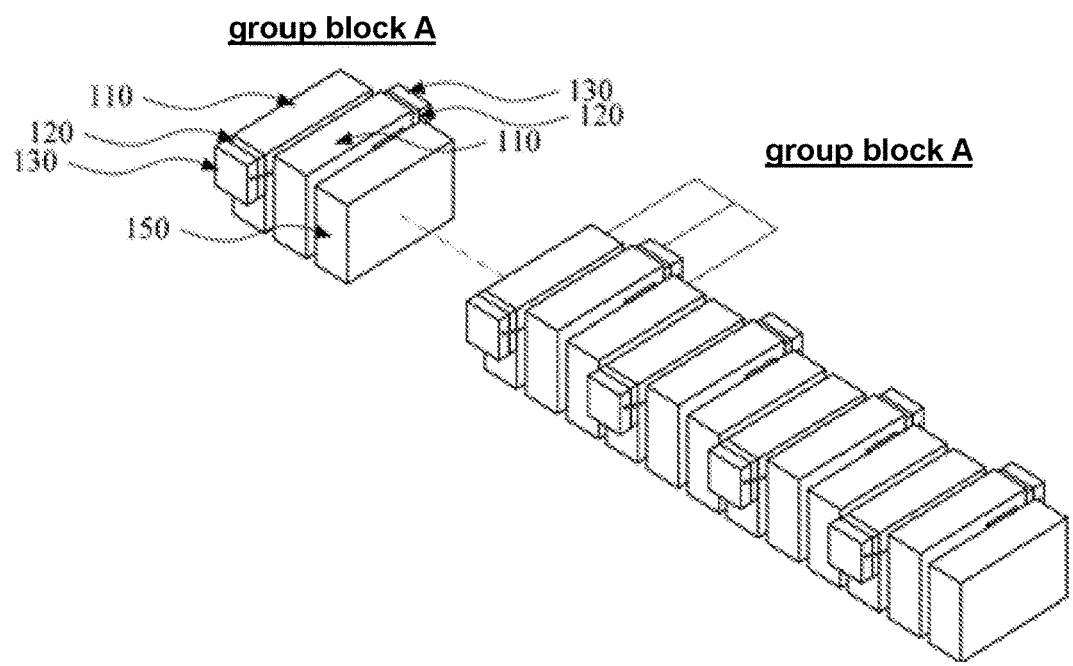

As illustrated in FIG. 5A, the main block 110 and the sub block 130 include a conductive metal. Also, the insulator 120 such as an insulating adhesive or an insulating epoxy is interposed between the main block 110 and the sub block 130. Thus, the main block 110 and the sub block 130 are insulated from each other and combined to each other.

Figure 4:
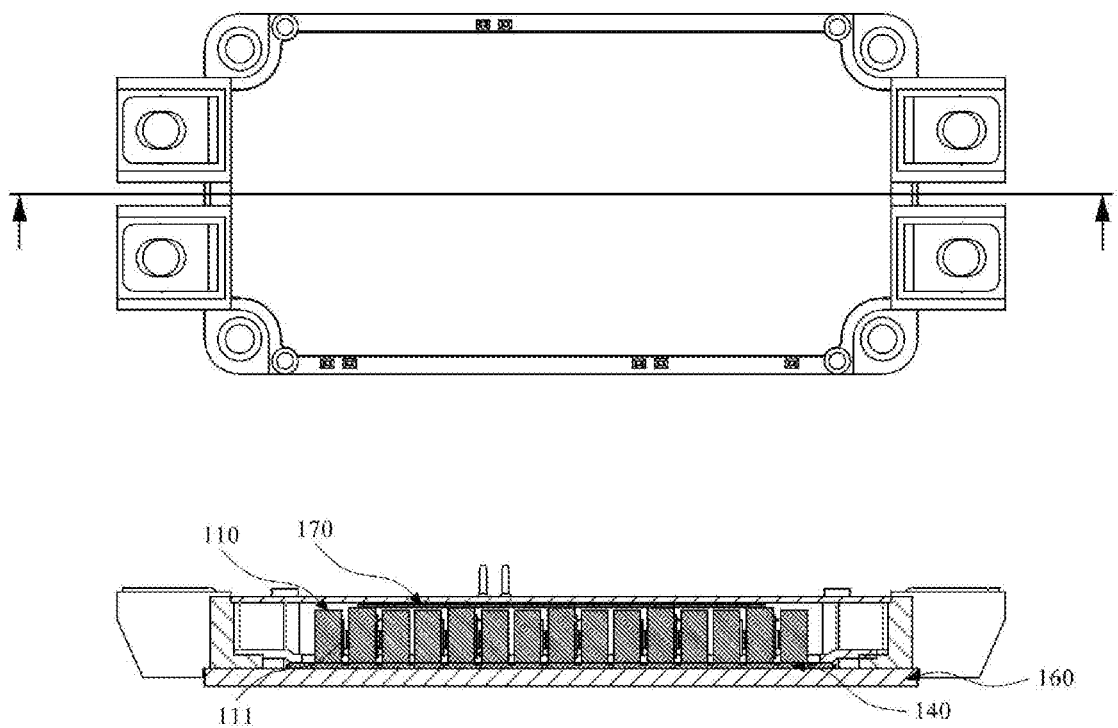
FIG. 4 is a cross-sectional view of the semiconductor package of FIGS. 2A and 2B.
Figure 13:
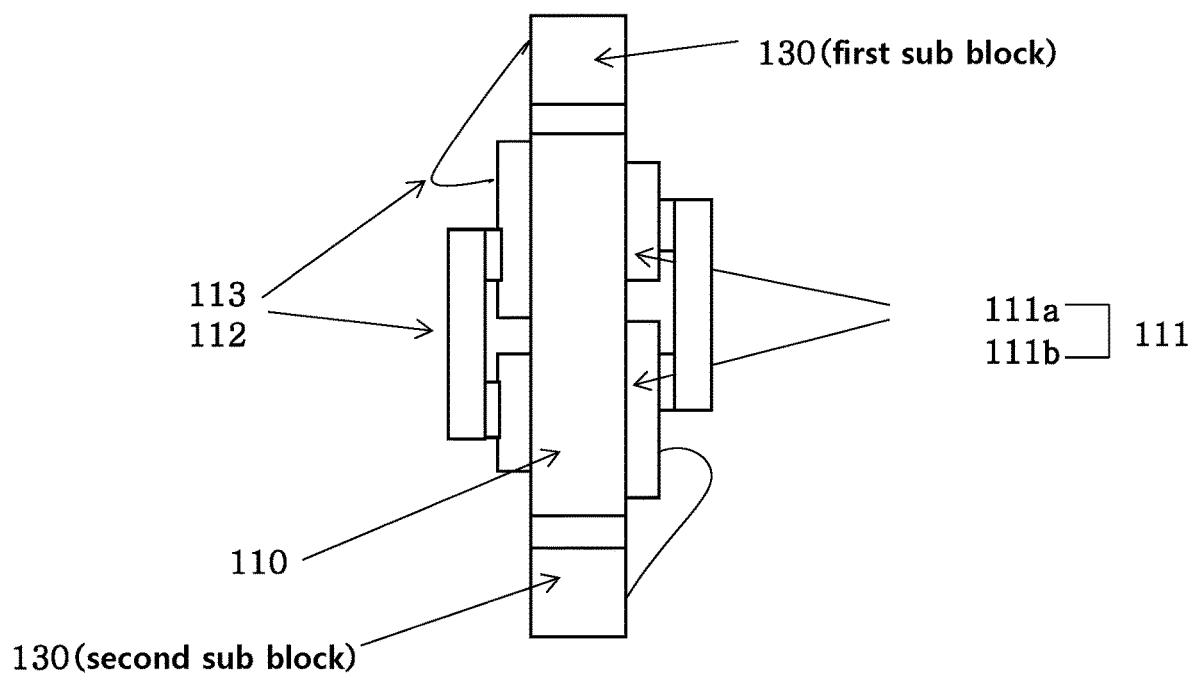
FIG. 13 is a side view illustrating a group block of the semiconductor package of FIGS. 8A and 8B.

As illustrated in FIGS. 4, 5A, and 13, the semiconductor chip 111 may be attached to an upper surface or upper and lower surfaces of the main block 110 by using an adhesive including a solder base or a sintering material such as Ag or Cu.

Here, referring to FIG. 13, at least one or more power semiconductor chips 111 may be attached to the upper surface or upper and lower surfaces of the main block 110 and as needed, an accumulation rate of the semiconductor chip 111 may be controlled.

In addition, the semiconductor chips 111 may be electrically connected to each other by using a metal clip 112. Also, the semiconductor chip 111 may be connected to one or more first sub block or second sub block of the sub block 130 as needed, by using a conductive wire 113 or a conductive metal (not illustrated), which is a gate signal line.

For example, the semiconductor chip 111 includes a power diode 111a and a power DVC 111b (IGBT, MOSFET, or GaN), wherein the power diode 111a and the power DVC 111b are electrically connected to each other by using the metal clip 112. The power diode 111a and the sub block 130 are electrically connected to each other by using the conductive wire 113 or a conductive metal (not illustrated) so as to form a power block as a unit. A group block A including a first power block, a second power block, and a spacer block 150 is set at a side to be vertically attached to the pattern 141 of the substrate 140 and may be electrically connected to the pattern 141 of the substrate 140.

Here, one side of the main block 110 may be vertically attached to the pattern 141 of the substrate 140 by using ultrasonic welding, soldering or sintering and may be electrically connected to the pattern 141 of the substrate 140.

Also, as illustrated in FIGS. 3A, 3B, 4, and 6, the substrate 140 includes an insulating material and the metal pattern 141 formed on the insulating material and may be formed after forming an electrical pattern on a base substrate having an excellent thermal conductivity and insulation property or attaching an insulating substrate including an electrical pattern to a base substrate.

Figure 3A:
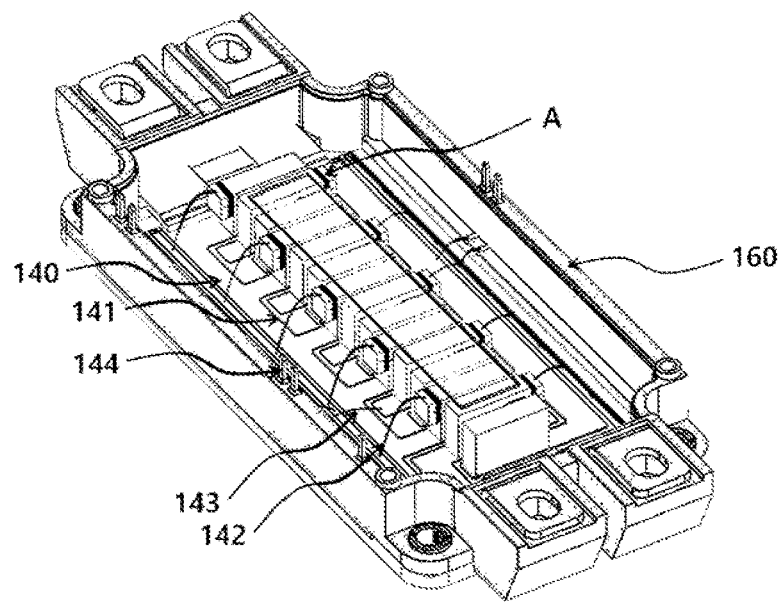
FIGS. 3A and 3B illustrate internal structures of the semiconductor package of FIGS. 2A and 2B.
Figure 3B:
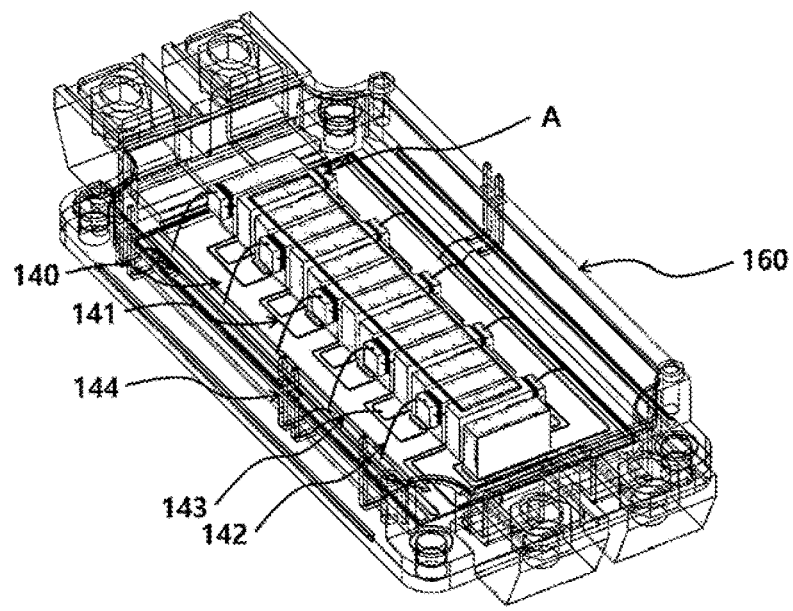
Figure 6:
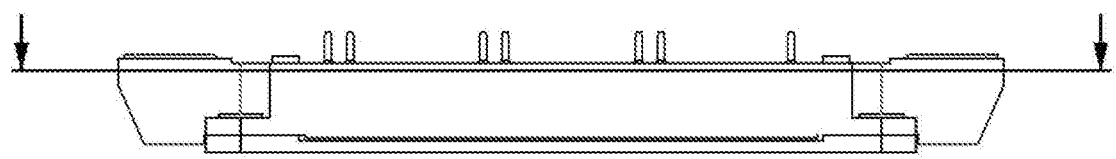
FIGS. 6 and 7 respectively illustrate an internal structure of the cut semiconductor package of FIGS. 2A and 2B.
Figure 6:
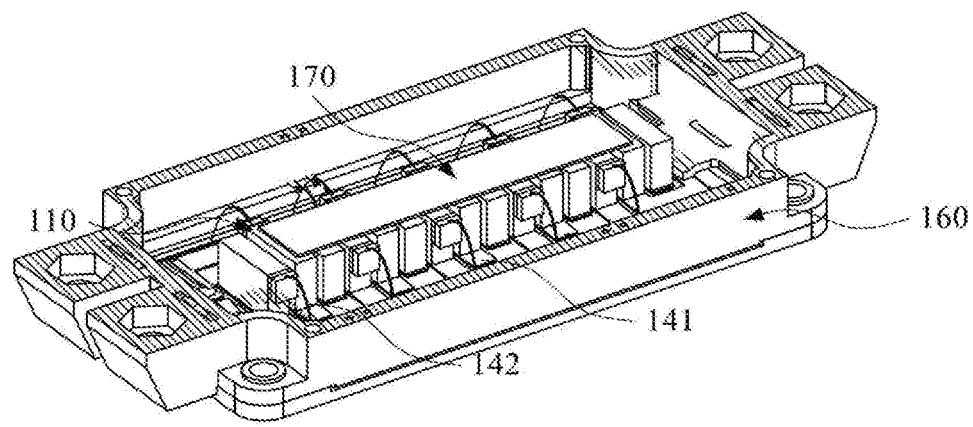

In addition, as illustrated in FIGS. 3A, 3B and 6, the sub block 130 of the group block and the substrate 140 are electrically connected to each other by using a conductive wire 142 or a conductive metal (not illustrated), which is a gate signal line, and thus, the sub block 130 and a circuit of the substrate 140 are connected to each other.

Figure 14A:
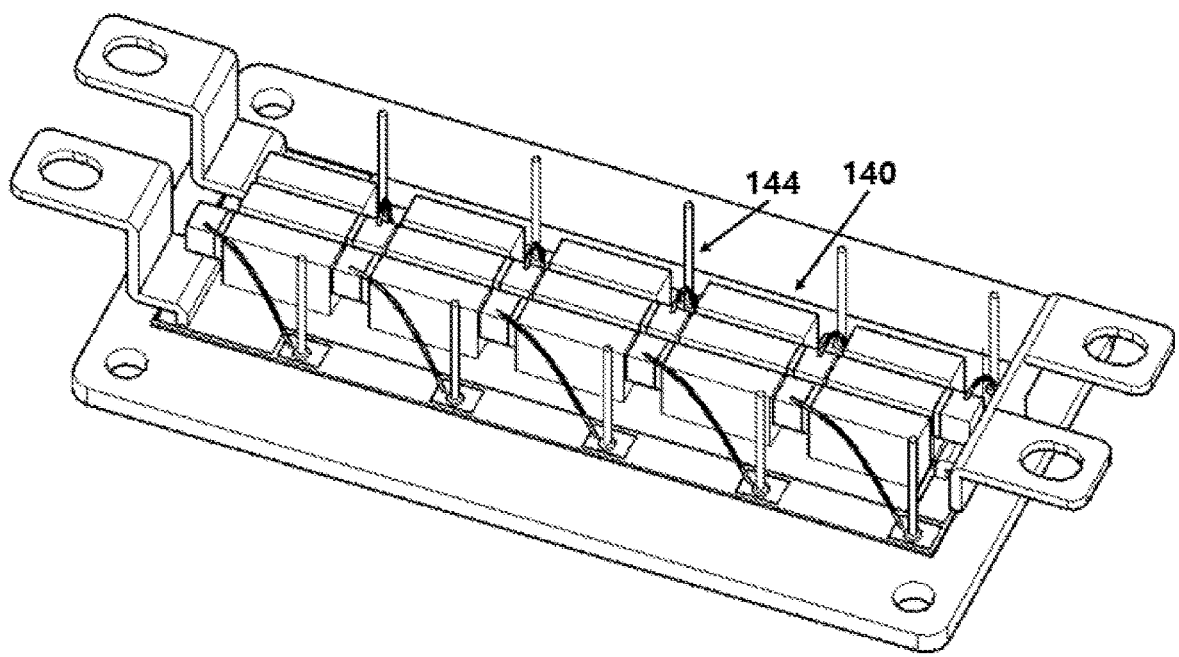
FIGS. 14A and 14B illustrate terminal pins of the semiconductor package of FIGS. 8A and 8B.
Figure 14B:
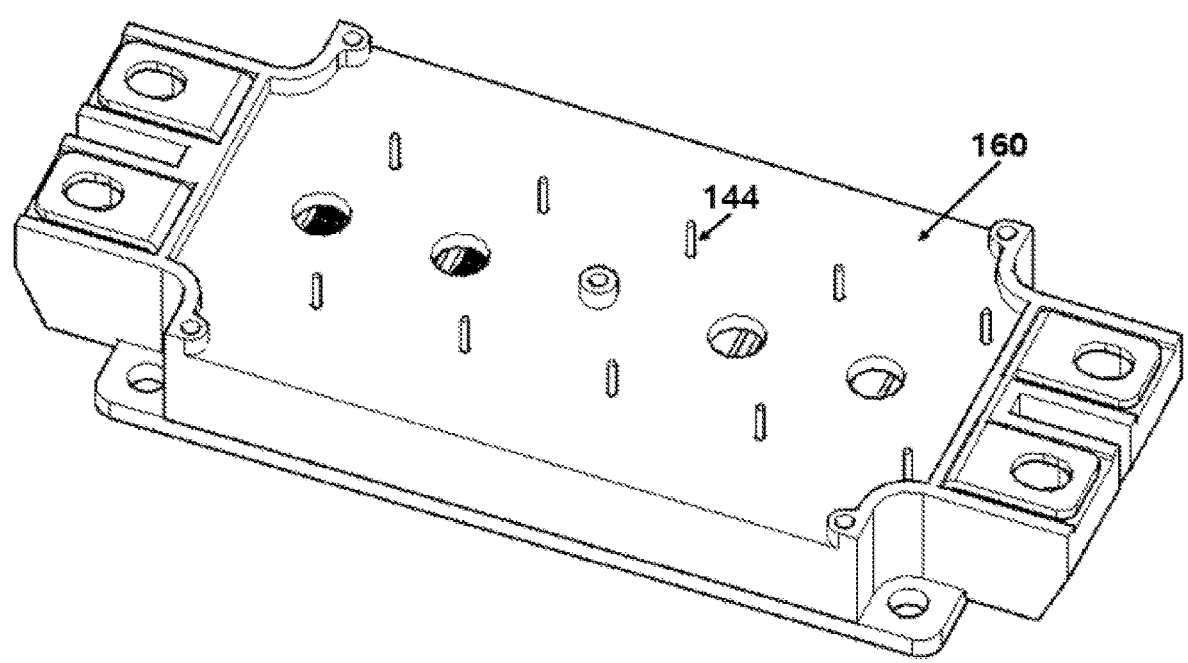

Moreover, the group block A and the substrate 140 may be further formed on a semiconductor package body 160. Here, a terminal pin 144 is formed to connect a conductive wire 143 connected to the substrate 140, wherein the terminal pin 144, for reference, may be vertically formed on the substrate 140 as illustrated in FIGS. 14A and 14B or the terminal pin 144 may be inserted into the semiconductor package body 160 as illustrated in FIGS. 2A to 3B. Accordingly, the terminal pin 144 may be electrically connected to the substrate 140 by using the conductive wire 143 or a conductive metal (not illustrated).

Figure 7:
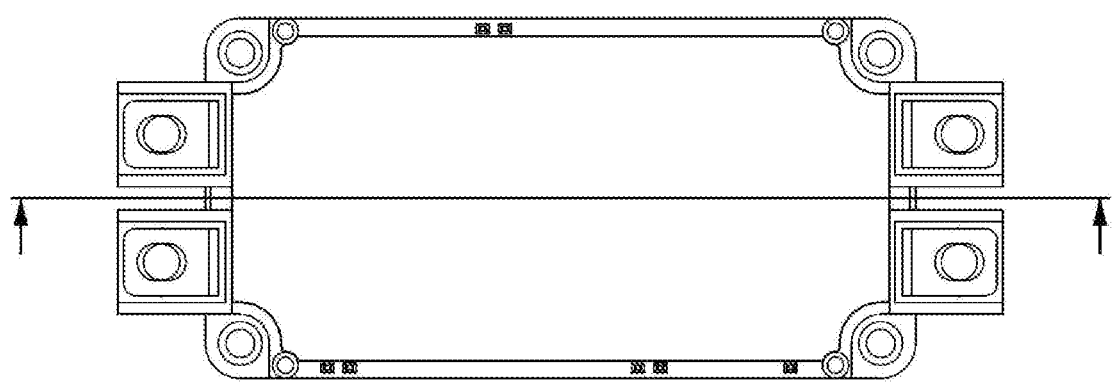
Figure 7:
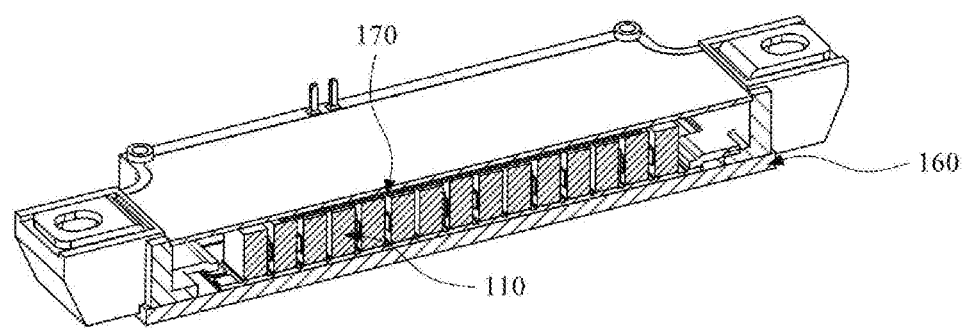
Figure 8A:
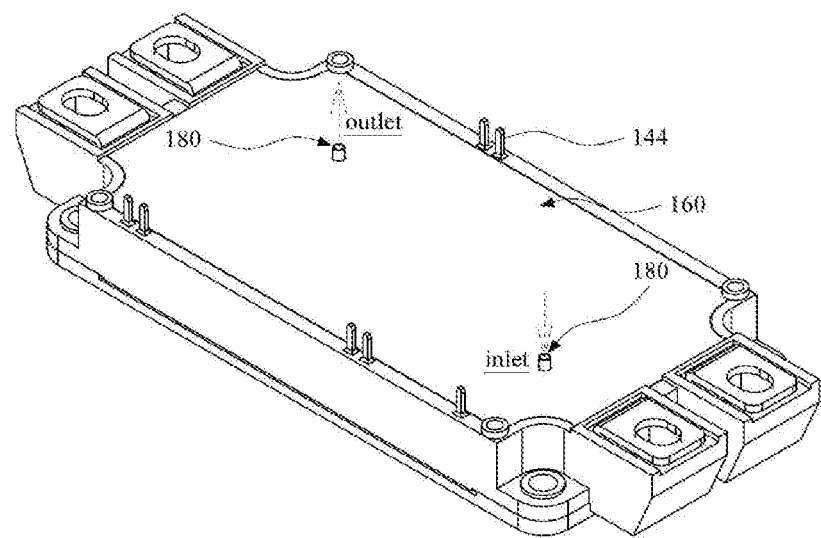
FIGS. 8A and 8B are perspective views of a semiconductor package according to another embodiment of the present invention.
Figure 8B:
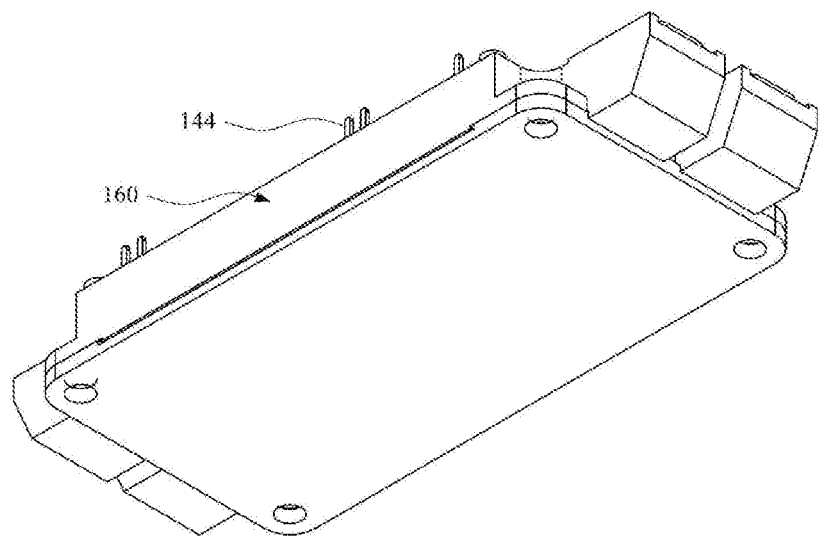

As illustrated in FIGS. 4, 6 and 7, another substrate 170 electrically connected to the other side of the main block 110 of the group block A may be further included.

Also, as illustrated in FIGS. 5A, 5B and 8A through 12, a semiconductor package according to another embodiment of the present invention is modularized and manufactured by preparing the main block 110 lifting the semiconductor chip 111 and having holes 114 through which a coolant circulates, the insulator 120, and the sub block 130, preparing the semiconductor chip 111, preparing an adhesive used in attaching the semiconductor chip 111, attaching the semiconductor chip 111 to an upper surface or upper and lower surfaces of the main block 110, performing an electrical connection of the semiconductor chip 111, preparing the substrate 140 including the pattern 141 enabling an electrical connection, vertically attaching one side of the main block 110 to the pattern 141 of the substrate 140, and enabling an electrical connection. Accordingly, an accumulation rate increases on the substrate 140 due to a vertically arranged structure of the semiconductor chip 111, a heat emission area is enlarged to improve a heat emission effect, and a coolant circulates to reduce heat generated from a semiconductor.

As illustrated in FIG. 5A, the main block 110 and the sub block 130 include a conductive metal. Also, the insulator 120 such as an insulating adhesive or an insulating epoxy is interposed between the main block 110 and the sub block 130. Thus, the main block 110 and the sub block 130 are insulated from each other and combined to each other.

Figure 12:
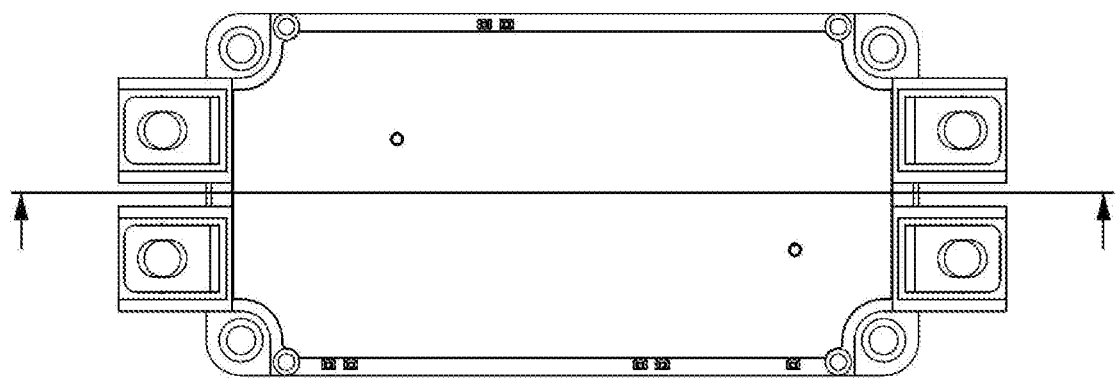
Figure 12:
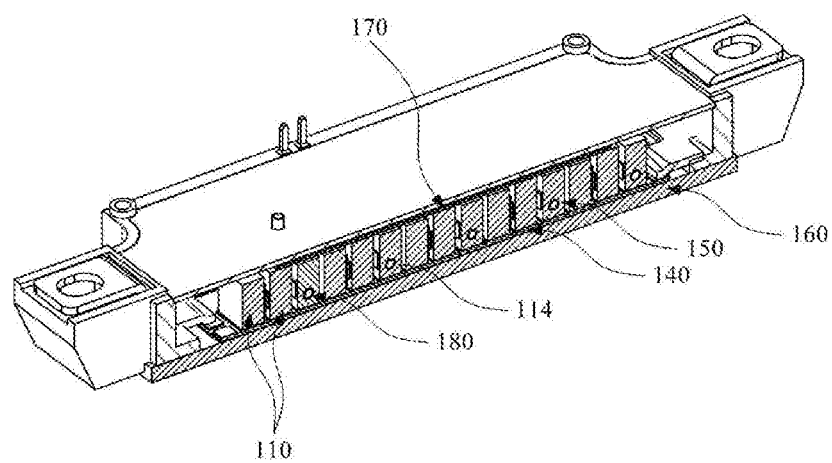

As illustrated in FIGS. 5A, 12, and 13, the semiconductor chip 111 may be attached to an upper surface or upper and lower surfaces of the main block 110 by using an adhesive including a solder base or a sintering material such as Ag or Cu.

Here, referring to FIG. 13, at least one or more power semiconductor chips 111 may be attached to the upper surface or upper and lower surfaces of the main block 110 and as needed, an accumulation rate of the semiconductor chip 111 may be controlled.

In addition, the semiconductor chips 111 may be electrically connected to each other by using the metal clip 112. Also, the semiconductor chip 111 may be connected to one or more first sub block or second sub block of the sub block 130 as needed, by using the conductive wire 113 or a conductive metal (not illustrated), which is a gate signal line.

For example, the semiconductor chip 111 includes the power diode 111a and the power DVC 111b (IGBT, MOSFET, or GaN), wherein the power diode 111a and the power DVC 111b are electrically connected to each other by using the metal clip 112. The power diode 111a and the sub block 130 are electrically connected to each other by using the conductive wire 113 or a conductive metal (not illustrated) so as to form a power block as a unit. The group block A including the first power block, the second power block, and the spacer block 150 sets at a side to be vertically attached to the pattern 141 of the substrate 140 and may be electrically connected to the pattern 141 of the substrate 140.

Here, one side of the main block 110 may be vertically attached to the pattern 141 of the substrate 140 by using ultrasonic welding, soldering or sintering and may be electrically connected to the pattern 141 of the substrate 140.

Figure 9A:
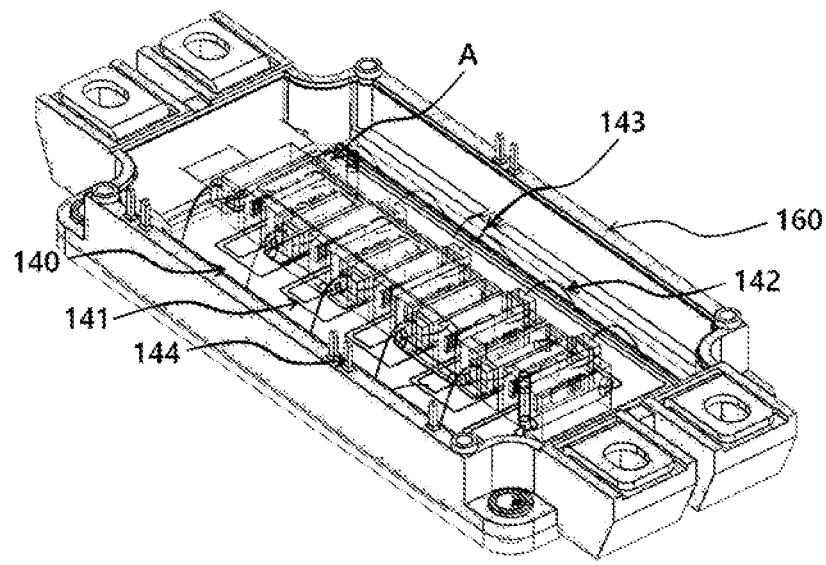
FIGS. 9A and 9B are internal structures of the semiconductor package of FIGS. 8A and 8B.
Figure 9B:
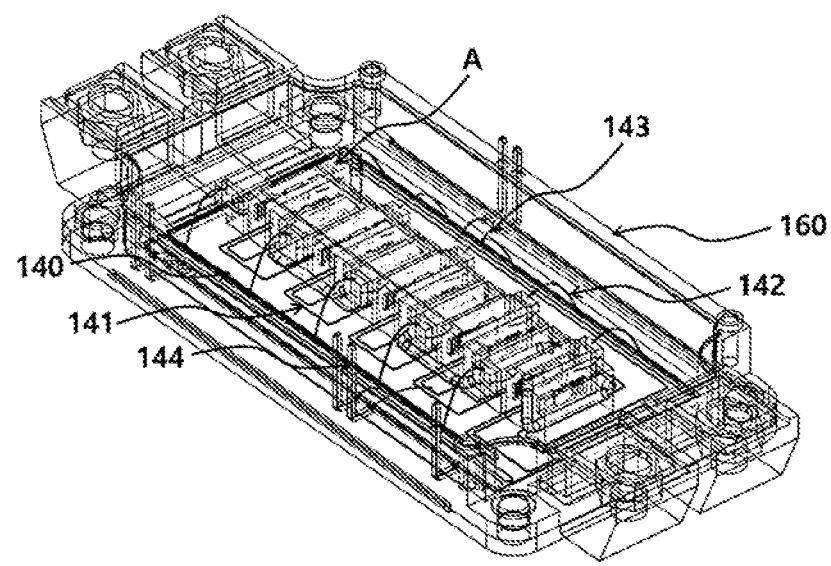
Figure 11:
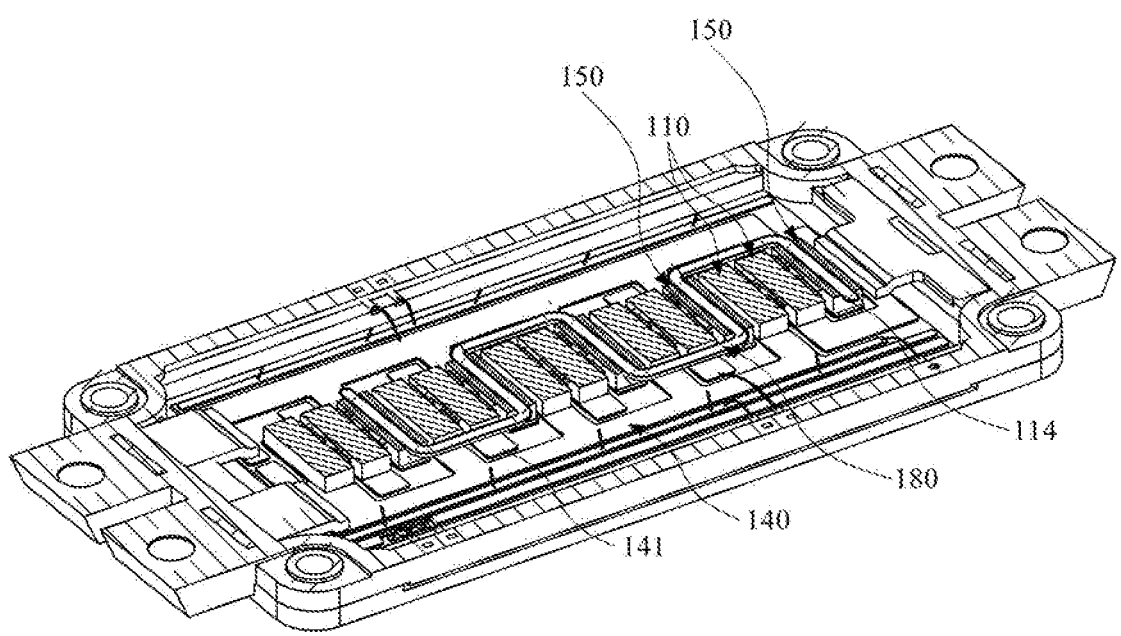

Also, as illustrated in FIGS. 9A, 9B and 11, the substrate 140 includes an insulating material and the metal pattern 141 formed on the insulating material and may be formed after forming an electrical pattern on a base substrate having an excellent thermal conductivity and insulation property or attaching an insulating substrate including an electrical pattern to a base substrate.

In addition, as illustrated in FIGS. 9A, 9B9 and 10, the sub block 130 of the group block and the substrate 140 are electrically connected to each other by using the conductive wire 142 or a conductive metal (not illustrated), which is a gate signal line, and thus, the sub block 130 and a circuit of the substrate 140 are connected to each other.

Moreover, the group block A and the substrate 140 may be further formed on the semiconductor package body 160. Here, the terminal pin 144 is formed to connect the conductive wire 143 connected to the substrate 140, wherein the terminal pin 144, for reference, may be vertically formed on the substrate 140 as illustrated in FIGS. 14A and 14B or the terminal pin 144 may be inserted into the semiconductor package body 160 and electrically connected to the substrate 140 by using the conductive wire 143 or a conductive metal (not illustrated) as illustrated in FIGS. 2A to 3B.

Figure 10:
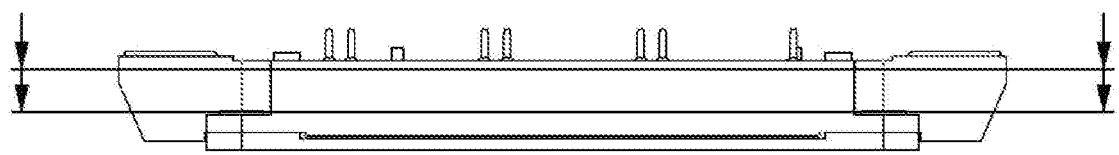
FIGS. 10 through 12 respectively illustrate an internal structure of the cut semiconductor package of FIGS. 8A and 8B.
Figure 10:
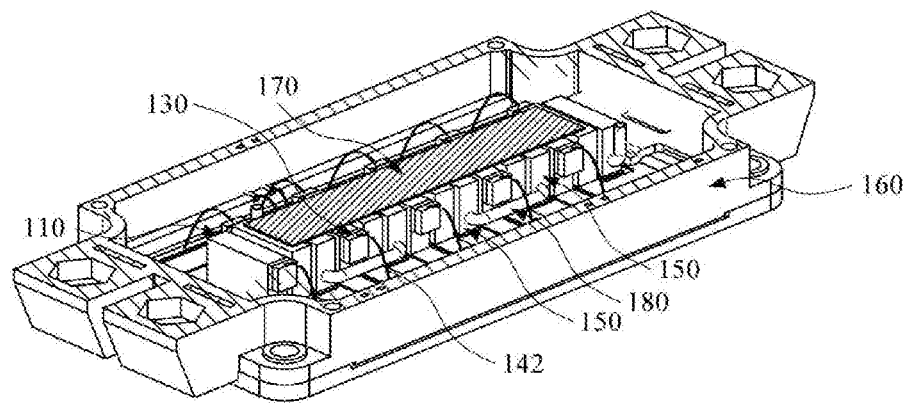

As illustrated in FIGS. 10 and 12, another substrate 170 electrically connected to the other side of the main block 110 of the group block A may be further included.

In addition, the coolant circulates after flowing in (inlet) from the outside of the semiconductor package body 160 and discharging (outlet) through a cooling pipe 180 extended to the holes 114 of the main block 110.

Here, the coolant may include air, nitrogen, or cooling water.

As illustrated in FIGS. 10 and 11, the coolant may circulate from the outside of the semiconductor package body 160 through the cooling pipe 180 extended to the holes 114 of the spacer block 150.

Figure 15:
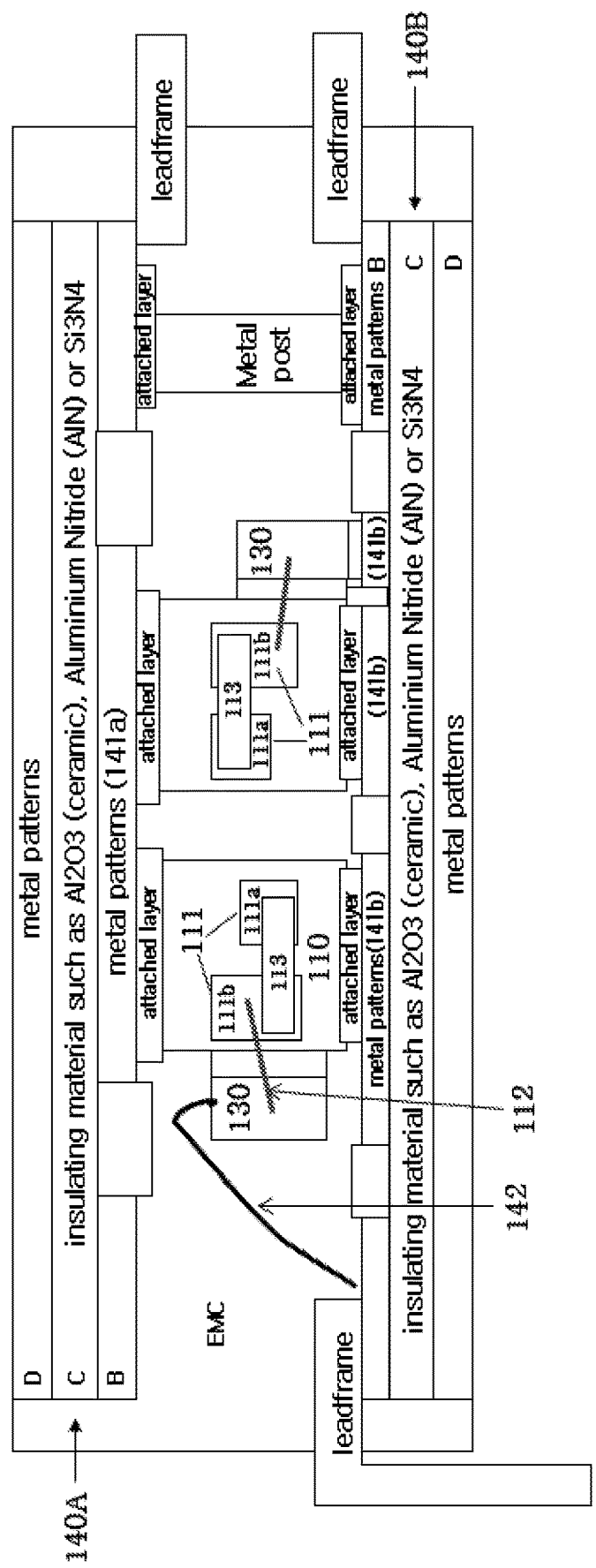
FIGS. 15 and 16 are cross-sectional views of a semiconductor package according to another embodiment of the present invention.
Figure 16:
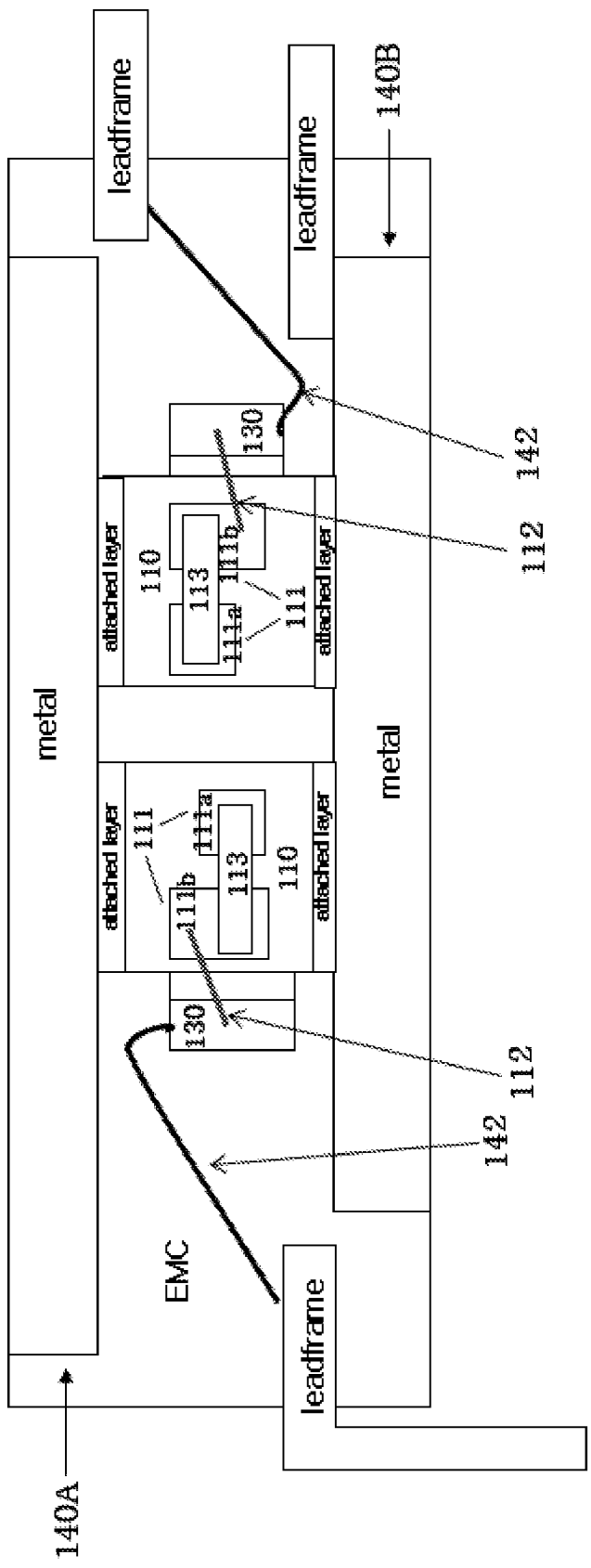
Figure 17A:
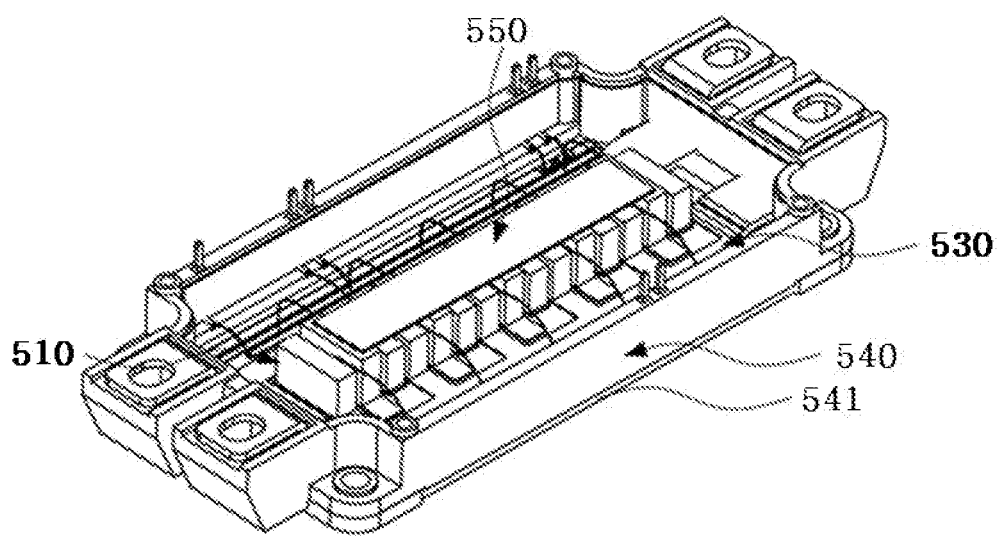
FIGS. 17A and 17B are perspective views of a semiconductor package according to another embodiment of the present invention.
Figure 17B:
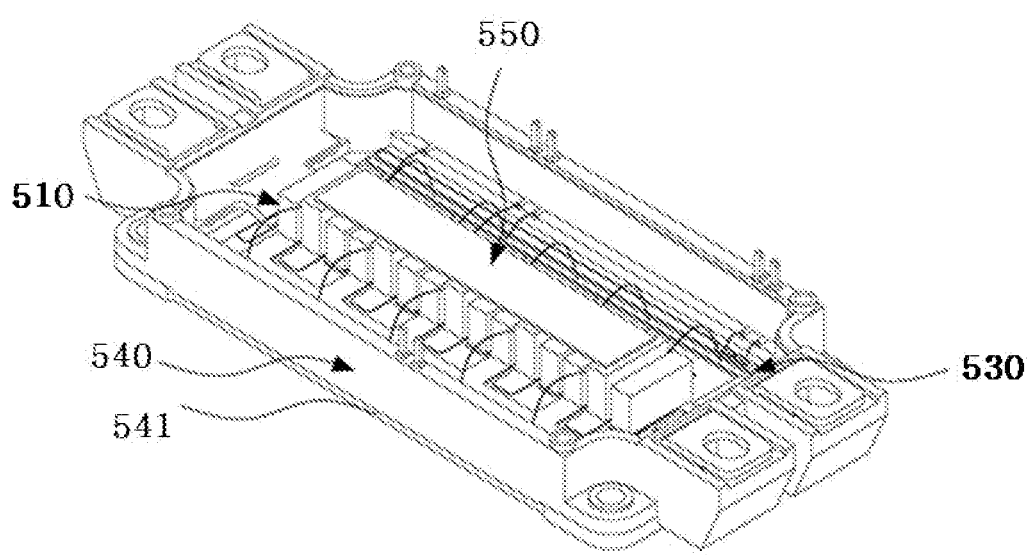

FIGS. 15 and 16 are cross-sectional views of a semiconductor package according to another embodiment of the present invention. Hereinafter, another embodiment of the present invention will be described in detail with reference to FIGS. 15 and 16. However, elements illustrated in FIGS. 15 and 16 which are same as the elements in FIGS. 2A through 7 are referred to as the description disclosed in FIGS. 2A through 7.

Referring to FIGS. 15 and 16, a semiconductor package according to another embodiment of the present invention is modularized and manufactured by preparing the main block 110 for lifting the semiconductor chip 111, the insulator 120, and the sub block 130, preparing the semiconductor chip 111, preparing an adhesive (not illustrated) used in attaching the semiconductor chip 111, attaching the semiconductor chip 111 to an upper surface or upper and lower surfaces of the main block 110, performing an electrical connection of the semiconductor chip 111, preparing an upper substrate 140A and a lower substrate 140B respectively including patterns 141a and 141b enabling an electrical connection, vertically attaching one side of the main block 110 to each of the patterns 141a and 141b of the upper substrate 140A and the lower substrate 140B, and enabling an electrical connection. Accordingly, an accumulation rate increases on the upper and lower substrates 140A and 140B due to a vertically arranged structure of the semiconductor chip 111, a heat emission area is enlarged to improve a heat emission effect, and the heat emission area may be expanded by the upper and lower substrates 140A and 140B.

As illustrated in FIG. 15, the upper and lower substrates 140A and 140B may be formed by stacking one or more metal layers B, the insulation layer C, and one or more metal layers D in order or by stacking one or more metal layers B and the insulation layer C in order. Here, the insulation layer C may be formed of an insulating material such as $Al_2O_3$ (ceramic), Aluminum Nitride (AlN), or $Si_3N_4$.

In addition, as illustrated in FIG. 16, the upper and lower substrates 140A and 140B may be formed as a single metal layer and may have a thickness of 0.1 mm through 10 mm.

As illustrated in FIG. 5A, the main block 110 and the sub block 130 include a conductive metal. Also, the insulator 120 such as an insulating adhesive or an insulating epoxy is interposed between the main block 110 and the sub block 130. Thus, the main block 110 and the sub block 130 are insulated from each other and combined to each other.

As illustrated in FIGS. 4, 5A, and 13, the semiconductor chip 111 may be attached to an upper surface or upper and lower surfaces of the main block 110 by using an adhesive including a solder base or a sintering material such as Ag or Cu.

Here, referring to FIG. 13, at least one or more power semiconductor chips 111 may be attached to the upper surface or upper and lower surfaces of the main block 110 and as needed, an accumulation rate of the semiconductor chip 111 may be controlled.

In addition, the semiconductor chips 111 may be electrically connected to each other by using the metal clip 112. Also, the semiconductor chip 111 may be connected to one or more first sub block or second sub block of the sub block 130 as needed, by using the conductive wire 113 or a conductive metal (not illustrated), which is a gate signal line.

For example, the semiconductor chip 111 includes the power diode 111a and the power DVC 111b (IGBT, MOSFET, or GaN), wherein the power diode 111a and the power DVC 111b are electrically connected to each other by using the metal clip 112. The power diode 111a and the sub block 130 are electrically connected to each other by using the conductive wire 113 or a conductive metal (not illustrated) so as to form a power block as a unit. The group block A including the first power block, the second power block, and the spacer block 150 is set at a side to be vertically attached between the patterns 141a and 141b of the upper substrate 140A and the lower substrate 140B and may be electrically connected to the patterns 141a and 141b of the upper substrate 140A and the lower substrate 140B.

Here, both sides of the main block 110 may be vertically attached to the patterns 141a and 141b of the upper substrate 140A and the lower substrate 140B by using ultrasonic welding, soldering or sintering and may be electrically connected to the patterns 141a and 141b of the upper substrate 140A and the lower substrate 140B.

Also, as illustrated in FIGS. 3A, 3B, 4, and 6, the substrate 140 includes an insulating material and the metal pattern 141 formed on the insulating material and may be formed after forming an electrical pattern on a base substrate having an excellent thermal conductivity and insulation property or attaching an insulating substrate including an electrical pattern to a base substrate.

In addition, as illustrated in FIGS. 3A, 3B and 6, the sub block 130 of the group block and the substrate 140 are electrically connected to each other by using the conductive wire 142 or a conductive metal (not illustrated), which is a gate signal line, and thus, the sub block 130 and a circuit of the substrate 140 are connected to each other.

Moreover, the group block A and the substrate 140 may be further formed on the semiconductor package body 160. Here, the terminal pin 144 is formed to connect the conductive wire 143 connected to the substrate 140, wherein the terminal pin 144, for reference, may be vertically formed on the substrate 140 as illustrated in FIGS. 14A and 14B or the terminal pin 144 may be inserted into the semiconductor package body 160 as illustrated in FIGS. 2A to 3B. Accordingly, the terminal pin 144 may be electrically connected to the substrate 140 by using the conductive wire 143 or a conductive metal (not illustrated).

Although not illustrated, a semiconductor package according to another embodiment of the present invention will be described as follows. Hereinafter, elements that are same as the elements according to another embodiment of the present invention are referred to as the description disclosed in FIGS. 8A through 12, 15, and 16.

A semiconductor package according to another embodiment of the present invention is modularized and manufactured by preparing the main block 110 for lifting the semiconductor chip 111 and having the hole 114 through which a coolant circulates, the insulator 120, and the sub block 130, preparing the semiconductor chip 111, preparing an adhesive used in attaching the semiconductor chip 111, attaching the semiconductor chip 111 to an upper surface or upper and lower surfaces of the main block 110, performing an electrical connection of the semiconductor chip 111, preparing the upper substrate 140A and the lower substrate 140B respectively including the patterns 141a and 141b enabling an electrical connection, vertically attaching one side of the main block 110 to each of the patterns 141a and 141b of the upper substrate 140A and the lower substrate 140B, and enabling an electrical connection. Accordingly, an accumulation rate increases on the upper and lower substrates 140A and 140B due to a vertically arranged structure of the semiconductor chip 111, a heat emission area is enlarged to improve a heat emission effect, the heat emission area may be expanded by the upper and lower substrates 140A and 140B, and a coolant circulates to reduce heat generated from a semiconductor.

As illustrated in FIG. 15, the upper and lower substrates 140A and 140B may be formed by stacking one or more metal layers B, the insulation layer C, and one or more metal layers D in order or by stacking one or more metal layers B and the insulation layer C in order. Here, the insulation layer C may be formed of an insulating material such as $Al_2O_3$ (ceramic), Aluminium Nitride (AlN) or $Si_3N_4$.

In addition, as illustrated in FIG. 16, the upper and lower substrates 140A and 140B may be formed as a single metal layer and may have a thickness of 0.1 mm through 10 mm.

As illustrated in FIG. 5A, the main block 110 and the sub block 130 include a conductive metal. Also, the insulator 120 such as an insulating adhesive or an insulating epoxy is interposed between the main block 110 and the sub block 130. Thus, the main block 110 and the sub block 130 are insulated from each other and combined to each other.

As illustrated in FIGS. 5A, 12, and 13, the semiconductor chip 111 may be attached to an upper surface or upper and lower surfaces of the main block 110 by using an adhesive including a solder base or a sintering material such as Ag or Cu.

Here, referring to FIG. 13, at least one or more power semiconductor chips 111 may be attached to the upper surface or upper and lower surfaces of the main block 110 and as needed, an accumulation rate of the semiconductor chip 111 may be controlled.

In addition, the semiconductor chips 111 may be electrically connected to each other by using the metal clip 112. Also, the semiconductor chip 111 may be connected to one or more first sub block or second sub block of the sub block 130 as needed, by using the conductive wire 113 or a conductive metal (not illustrated), which is a gate signal line.

For example, the semiconductor chip 111 includes the power diode 111a and the power DVC 111b (IGBT, MOSFET, or GaN), wherein the power diode 111a and the power DVC 111b are electrically connected to each other by using the metal clip 112. The power diode 111a and the sub block 130 are electrically connected to each other by using the conductive wire 113 or a conductive metal (not illustrated) so as to form a power block as a unit. The group block A including the first power block, the second power block, and the spacer block 150 is set at a side to be vertically attached between the patterns 141a and 141b of the upper substrate 140A and the lower substrate 140B and may be electrically connected to the patterns 141a and 141b of the upper substrate 140A and the lower substrate 140B.

Here, both sides of the main block 110 may be vertically attached to the patterns 141a and 141b of the upper substrate 140A and the lower substrate 140B by using ultrasonic welding, soldering or sintering and may be electrically connected to the patterns 141a and 141b of the upper substrate 140A and the lower substrate 140B.

Also, as illustrated in FIGS. 9A, 9B and 11, the substrate 140 includes an insulating material and the metal pattern 141 formed on the insulating material and may be formed after forming an electrical pattern on a base substrate having an excellent thermal conductivity and insulation property or attaching an insulating substrate including an electrical pattern to a base substrate.

In addition, as illustrated in FIGS. 9A, 9B and 10, the sub block 130 of the group block and the substrate 140 are electrically connected to each other by using the conductive wire 142 or a conductive metal (not illustrated), which is a gate signal line, and thus, the sub block 130 and a circuit of the substrate 140 are connected to each other.

Moreover, the group block A and the substrate 140 may be further formed on the semiconductor package body 160. Here, the terminal pin 144 is formed to connect the conductive wire 143 connected to the substrate 140, wherein the terminal pin 144, for reference, may be vertically formed on the substrate 140 as illustrated in FIGS. 14A and 14B or the terminal pin 144 may be inserted into the semiconductor package body 160 as illustrated in FIGS. 2A to 3B. Accordingly, the terminal pin 144 may be electrically connected to the substrate 140 by using the conductive wire 143 or a conductive metal (not illustrated).

The coolant circulates after flowing in (inlet) from the outside of the semiconductor package body 160 and discharging (outlet) through the cooling pipe 180 extended to the holes 114 of the main block 110.

Here, the coolant may include air, nitrogen, or cooling water.

As illustrated in FIGS. 10 and 11, the coolant may circulate from the outside of the semiconductor package body 160 through the cooling pipe 180 extended to the holes 114 of the spacer block 150.

The power block, the group block, and a lead frame are attached to the upper substrate 140A and the lower substrate 140B of the semiconductor package according to another embodiment of the present invention and a sealing material such as Epoxy Molding Compound (EMC) is used to surround the upper substrate 140A and the lower substrate 140B to which the power block, the group block, and the lead frame are attached. Therefore, a module is finally formed.

Accordingly, in the semiconductor package described above, an accumulation rate on a substrate increases due to a vertically arranged structure of a semiconductor chip, a heat emission area is enlarged to improve a heat emission effect, the cooling pipe passing through a block is included to increase an accumulation rate on a substrate due to a vertically arranged structure of a semiconductor chip, a heat emission area is enlarged to improve a heat emission effect, a coolant circulates to reduce heat generated from a semiconductor, a semiconductor chip is vertically arranged between an upper substrate and a lower substrate to expand a heat emission area, and a cooling effect may be improved.

Also, a semiconductor package according to another embodiment of the present invention includes a main block 510, one or more semiconductor chips 520 attached to one side of the main block 510, a first pattern substrate 530 including a pattern enabling an electrical connection, and a package body 540 surrounding the main block 510 and the semiconductor chips 520, wherein the other side of the main block 510 is vertically attached and electrically connected to the first pattern substrate 530. Accordingly, an accumulation rate increases due to a vertically attached structure of the semiconductor chips, a heat emission area is enlarged to improve a heat emission effect, the semiconductor chips are directly and electrically connected to an external terminal, and therefore, a compact semiconductor package may be formed.

A semiconductor package according to another embodiment of the present invention disclosed above will be described in more detail with reference to FIGS. 17A through 24.

Figure 21:
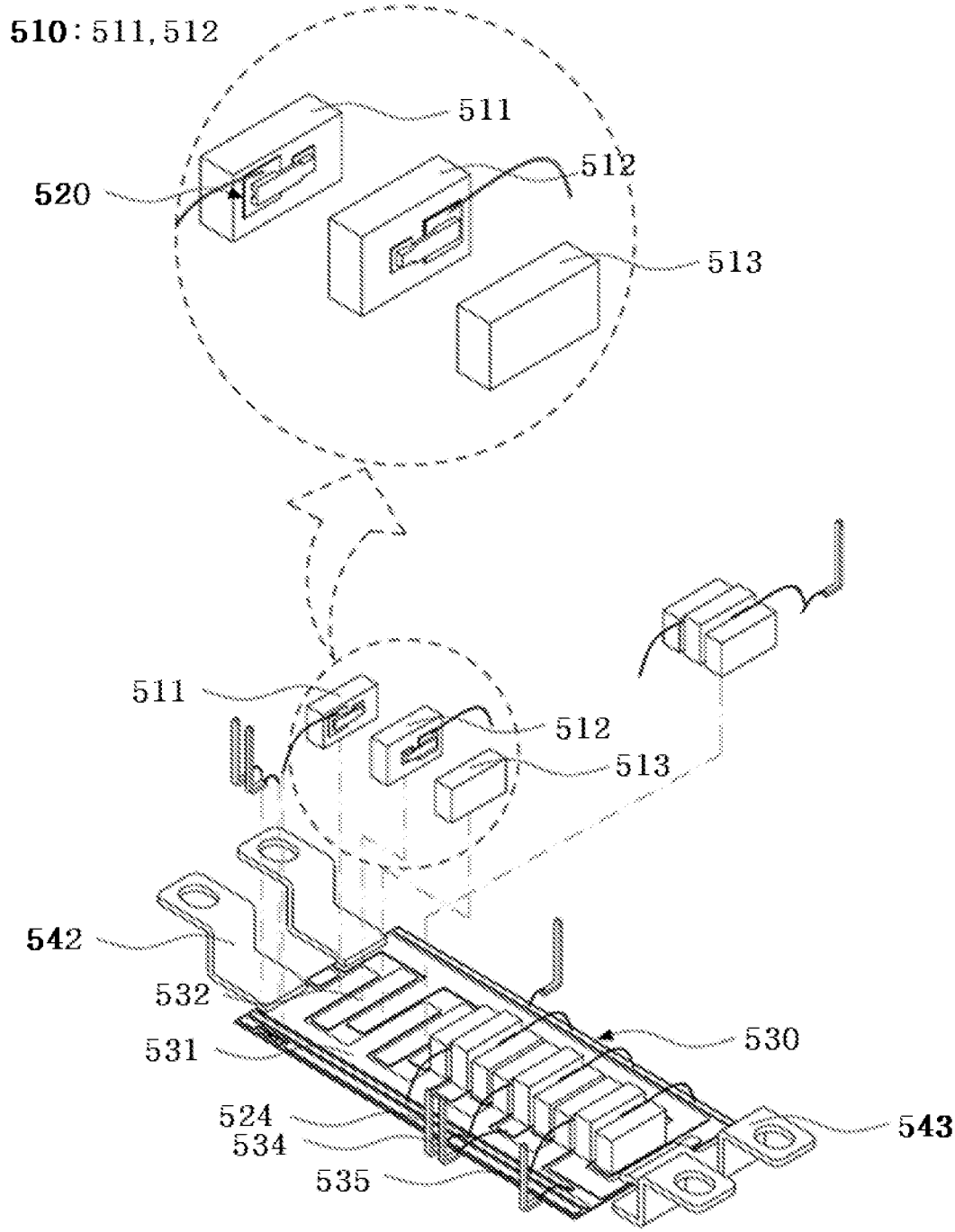

Firstly, as illustrated in FIG. 21, the main block 510 provides installation spaces for attaching the semiconductor chips 520, wherein the semiconductor chips 520 are attached on patterns 531 and 532 formed on the first pattern substrate 530 by ultrasonic welding, soldering, or sintering and are thereby, electrically connected to the patterns 531 and 532 formed on the first pattern substrate 530.

Here, the main block 510 may be formed of a conductive material or formed by plating a conductive metal on a surface of a non-conductive material.

As another embodiment of the present invention, the main block 510 may be formed of a conductive material including copper (Cu) or aluminum (Al) and if needed, may be additionally plated with a conductive metal on a surface thereof. Also, the main block 510 may be formed by plating a conductive metal on a surface of a non-conductive material such as ceramic or aluminum silicon carbide (AlSiC).

Figure 18:
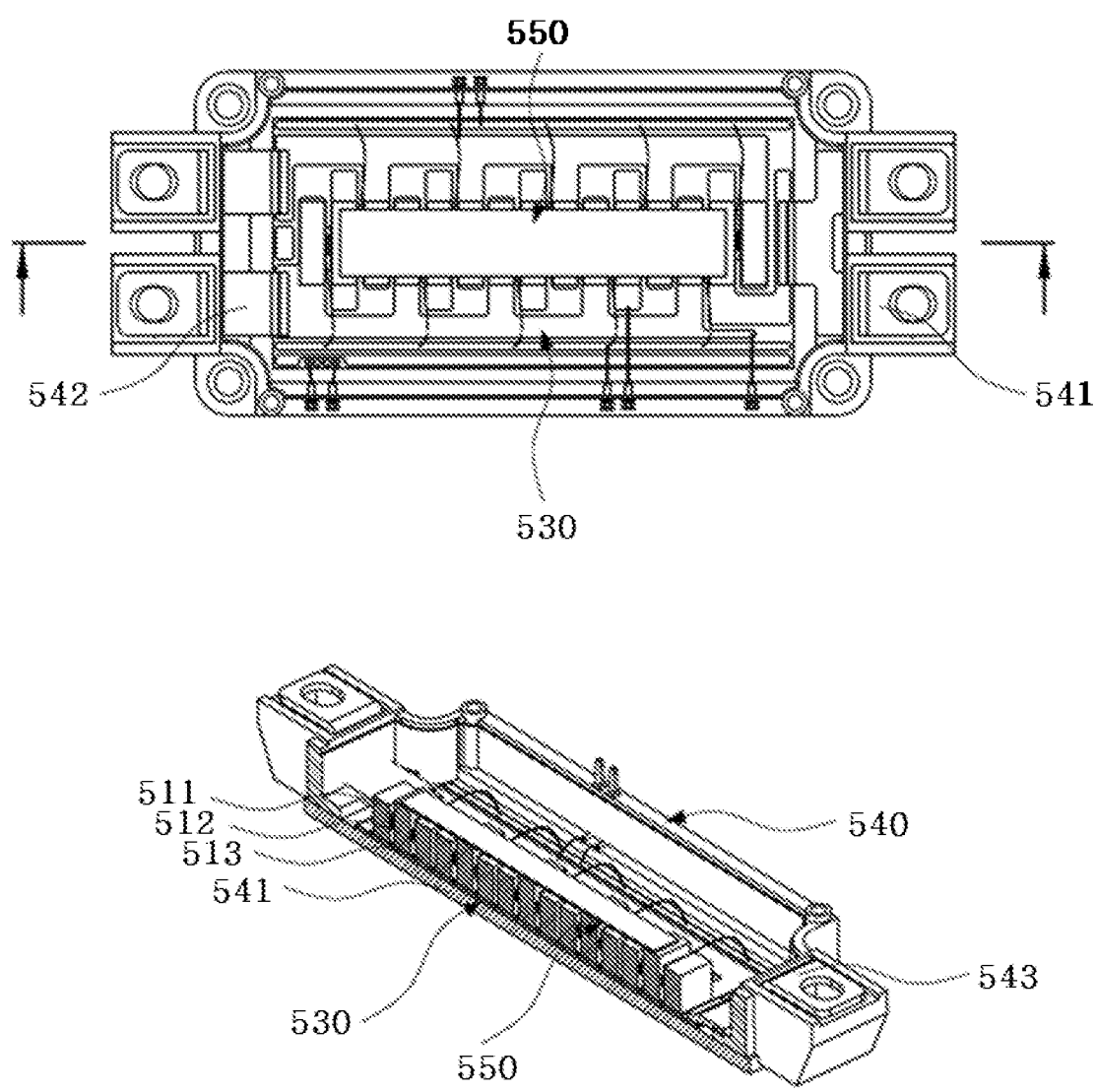
FIG. 18 is a cross-sectional view of the semiconductor package of FIGS. 17A and 17B.
Figure 20:
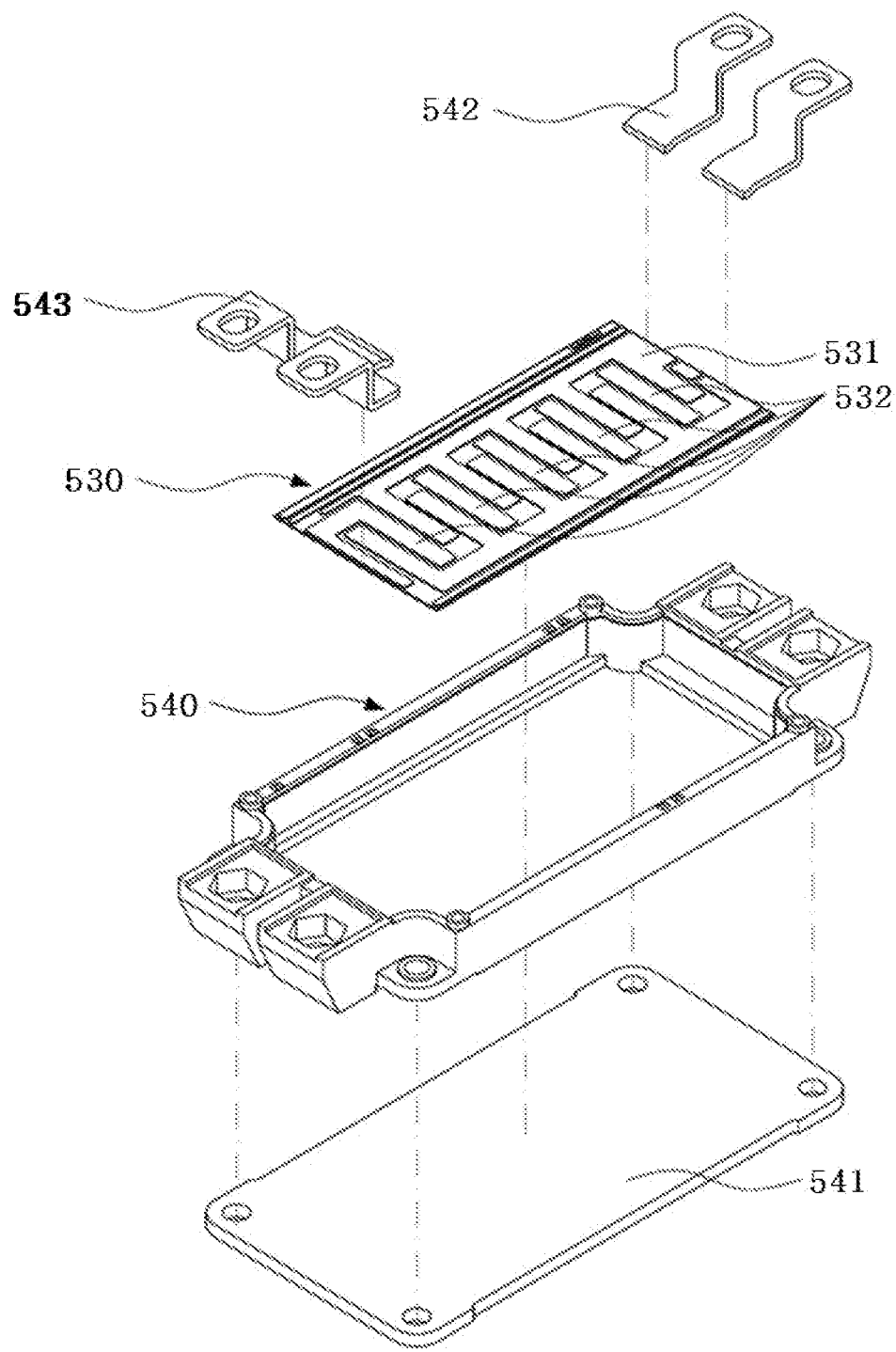

As illustrated in FIGS. 18, 20, and 21, the main block 510 includes a first main block 511 and a second main block 512, wherein a lower side surface of the first main block 511 is attached on the first pattern 531 of the first pattern substrate 530 and a lower side surface of the second main block 512 is attached on the second pattern 532 of the first pattern substrate 530. Here, the first main block 511 and the second main block 512 may have the same vertical height or different vertical heights so as to be attached on the first pattern substrate 530 at each different vertical height.

Next, at least one semiconductor chips 520 are attached to one surface of the main block 510.

Figure 22:
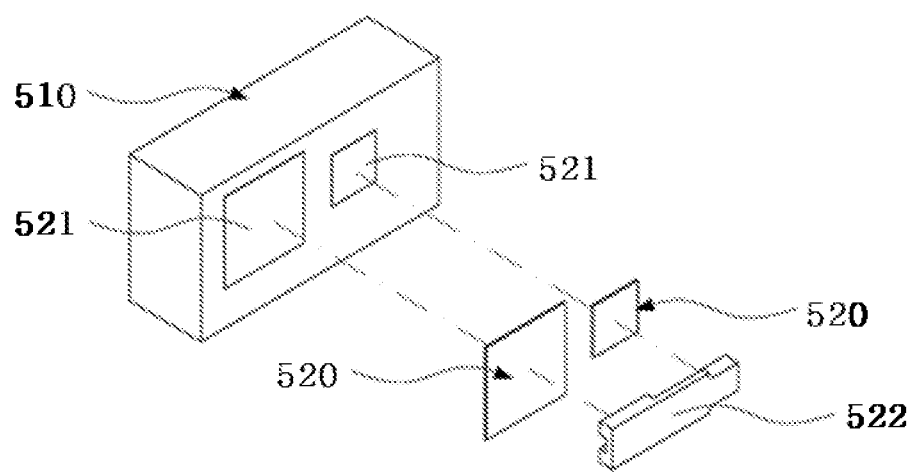
FIG. 22 illustrates elements separated from a semiconductor chip of the semiconductor package of FIGS. 17A and 17B.

That is, as illustrated in FIG. 22, one or more semiconductor chips 520 are attached on an upper surface of the main block 510 and a lower surface or a side of the main block 510, on which the semiconductor chips 520 are not attached, may be vertically attached and electrically connected to the first pattern substrate 530.

Here, the semiconductor chips 520 may include a power diode and a power DVC (IGBT, MOSFET, or GaN). A conductive adhesive 521 including a solder base or a sintering material such as Ag or Cu is included in the semiconductor chips 520 and is attached on the upper surface of the main block 510. The semiconductor chips 520 may be electrically connected to the main block 510 by using a metal clip 522 or a conductive wire.

Also, the semiconductor chip 520 attached to one surface of the main block 510 may be directly connected to the first pattern substrate 530 by using an electrical connecting member.

Figure 23A:
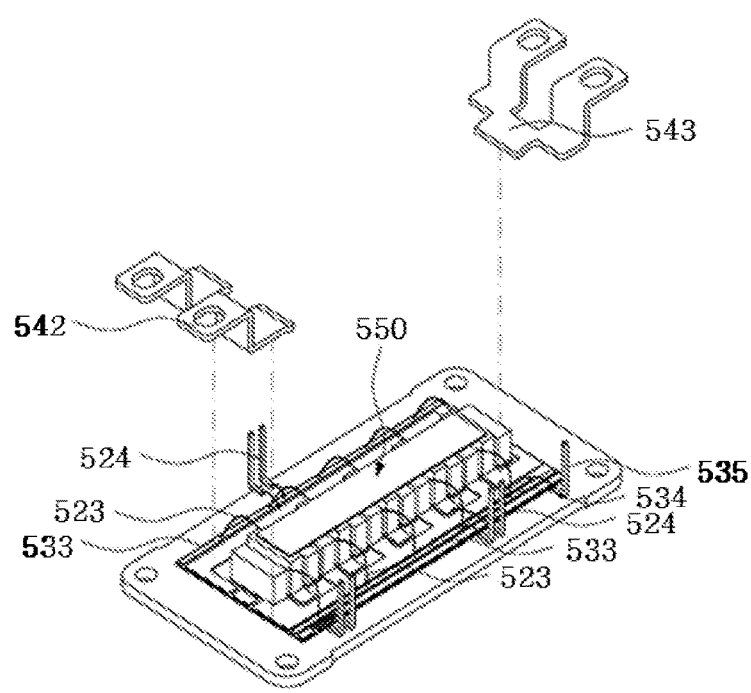
FIGS. 23A, 23B and 24 respectively illustrate a wiring structure of the semiconductor package of FIGS. 17A and 17B.
Figure 23B:
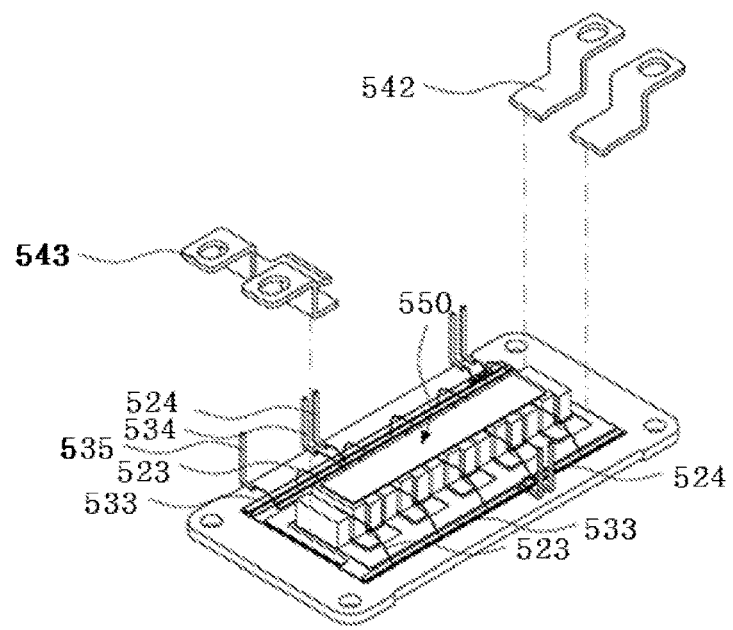

That is, as illustrated in FIGS. 23A and 23B, the electrical connecting member may be a conductive wire 523 connected to a third pattern 533 of the first pattern substrate 530 or a metal clip, and the semiconductor chip 520 may be electrically connected to the first pattern substrate 530 through a terminal pin 524 electrically connected to the third pattern 533.

Although not illustrated, the semiconductor chips 520 and the first pattern substrate 530 may include a conductive medium including a separate conductive metal, or a sub block interposed therebetween and may be electrically connected to each other.

In other words, according to a package structure, the semiconductor chips 520 may be directly attached to the third pattern 533 of the first pattern substrate 530 by using an electrical connecting member and may be electrically connected to the third pattern 533 of the first pattern substrate 530. Also, the semiconductor chips 520 may be indirectly attached to the third pattern 533 of the first pattern substrate 530 by using a conductive medium or a sub block and may be electrically connected to the third pattern 533 of the first pattern substrate 530. Here, an insulator may be interposed between the conductive medium or the sub block and the main block 510 so that the conductive medium or the sub block may be attached to the main block 510.

Next, a pattern enabling an electrical connection is formed on the first pattern substrate 530. As illustrated in FIGS. 20 and 21, the first main block 511 is attached and electrically connected to the first pattern 531 of the first pattern substrate 530, and the first pattern 531 may be electrically connected to an external terminal through a conductive wire and a terminal pin 535.

The second main block 512 is attached and electrically connected to the second pattern 532 of the first pattern substrate 530.

The first pattern substrate 530 may have a structure formed by stacking one or more metal layers and one or more insulation layers in order, wherein the structure may include a first metal layer, an insulation layer, and a second metal layer stacked in order.

Here, the insulation layer may include at least any one selected from ceramic ($Al_2O_3$), aluminum nitride (AlN), and silicon nitride ($Si_3N_4$).

Also, as illustrated in FIGS. 21, 23A and 23B, the second pattern 532 may be electrically connected to an external terminal through a conductive wire and a terminal pin 534.

The package body 540 surrounds and protects the main block 510 and the semiconductor chips 520. As illustrated in FIGS. 20 and 21, the package body 540 includes a first clip terminal 542 and a second clip terminal 543 penetrating the package body 540 at both sides thereof, wherein the first clip terminal 542 elastically presses the first pattern substrate 530, fixes the first pattern substrate 530 onto a base plate substrate 541, and applies an electrical signal to the first main block 511 through the first pattern 531, and the second clip terminal 543 applies an electrical signal to the second main block 512 through the second pattern 532.

Here, the first pattern substrate 530 may include a conductive or non-conductive adhesive (not illustrated) at the lower part thereof and may be attached on the base plate substrate 541.

In addition, the base plate substrate 541 may be formed of a conductive material or a non-conductive material.

A second pattern substrate 550 is formed on an upper part of the main block 510 and includes a pattern enabling an electrical connection thereon. The upper side surface and the lower side surface of the main block 510, where one or more semiconductor chips 520 are attached on the upper parts thereof, are each interposed between the first pattern substrate 530 and the second pattern substrate 550 and vertically attached to the first pattern substrate 530 and the second pattern substrate 550. Accordingly, the upper side surface and the lower side surface of the main block 510 may be electrically connected to the first pattern substrate 530 and the second pattern substrate 550.

Figure 19:
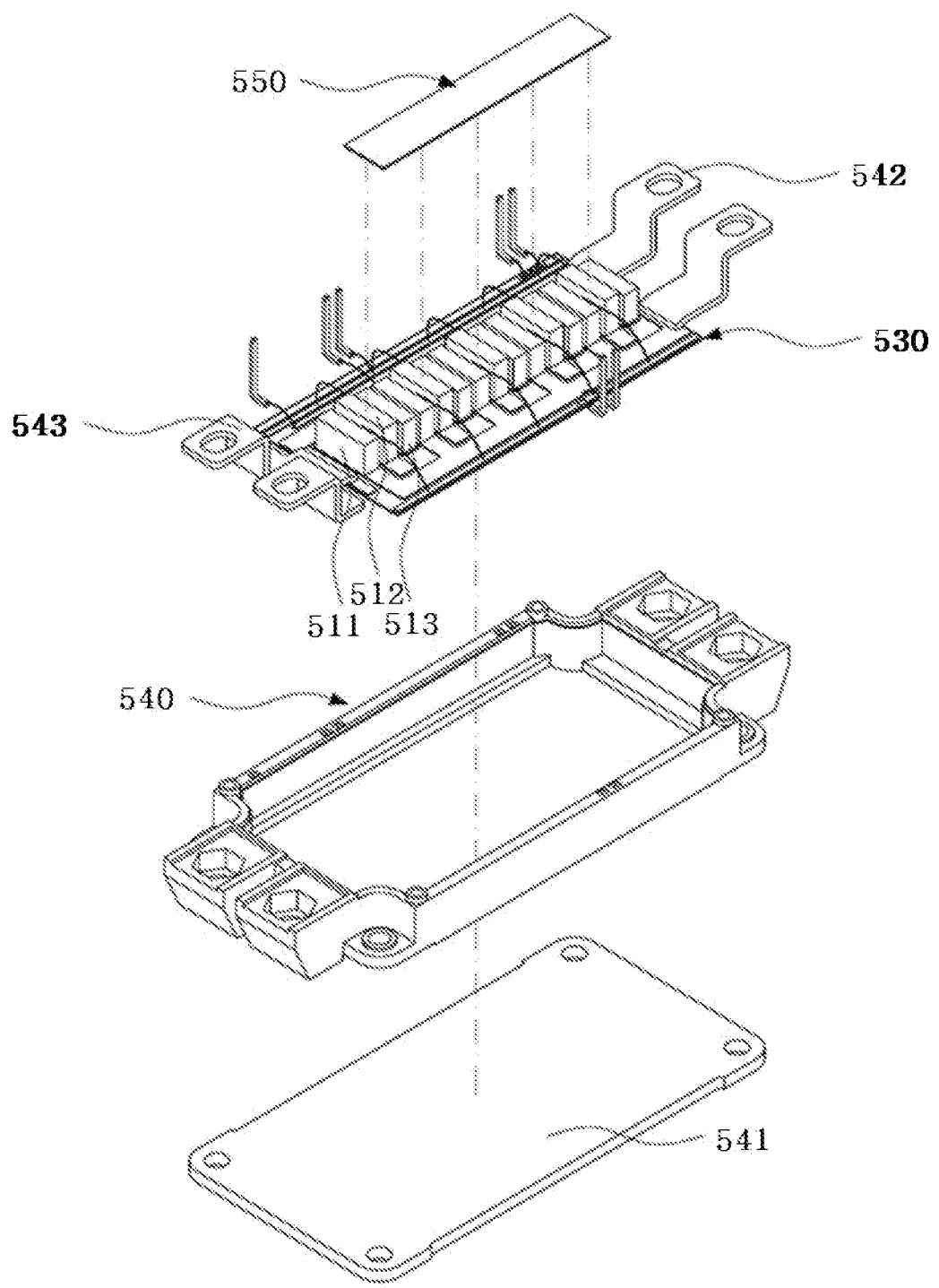
FIGS. 19 through 21 are respectively an exploded perspective view of the semiconductor package of FIGS. 17A and 17B.

According to another embodiment of the present invention, as illustrated in FIGS. 18 and 19, sides of the first main block 511 and the second main block 512, where the semiconductor chips 520 are not attached, stand vertically and are attached between the first pattern substrate 530 and the second pattern substrate 550. Here, the first main block 511 and the second main block 512 are formed to have different vertical heights. Accordingly, the first main block 511 is attached on the first pattern 531 of the first pattern substrate 530 and is electrically connected to the first clip terminal 542. The second main block 512 is attached on the second pattern 532 of the first pattern substrate 530, thereby, closely adhered to the second pattern substrate 550, and is electrically connected to the second pattern substrate 550 through the second clip terminal 543.

Here, the spacer 513 is interposed between the first main block 511 and the second main block 512. Then, the first main block 511, the second main block 512, and the spacer 513 may be arranged vertically in series between the first pattern substrate 530 and the second pattern substrate 550. The second pattern substrate 550 is formed on the upper parts of the second main blocks 512 as a single substrate and is electrically connected to the second main blocks 512. Also, the second pattern substrate 550 may be formed on the upper parts of the second main blocks 512 as a plurality of cut substrates so that the plurality of cut second pattern substrates 550 may each cross and electrically connect the second main blocks 512.

Figure 24:
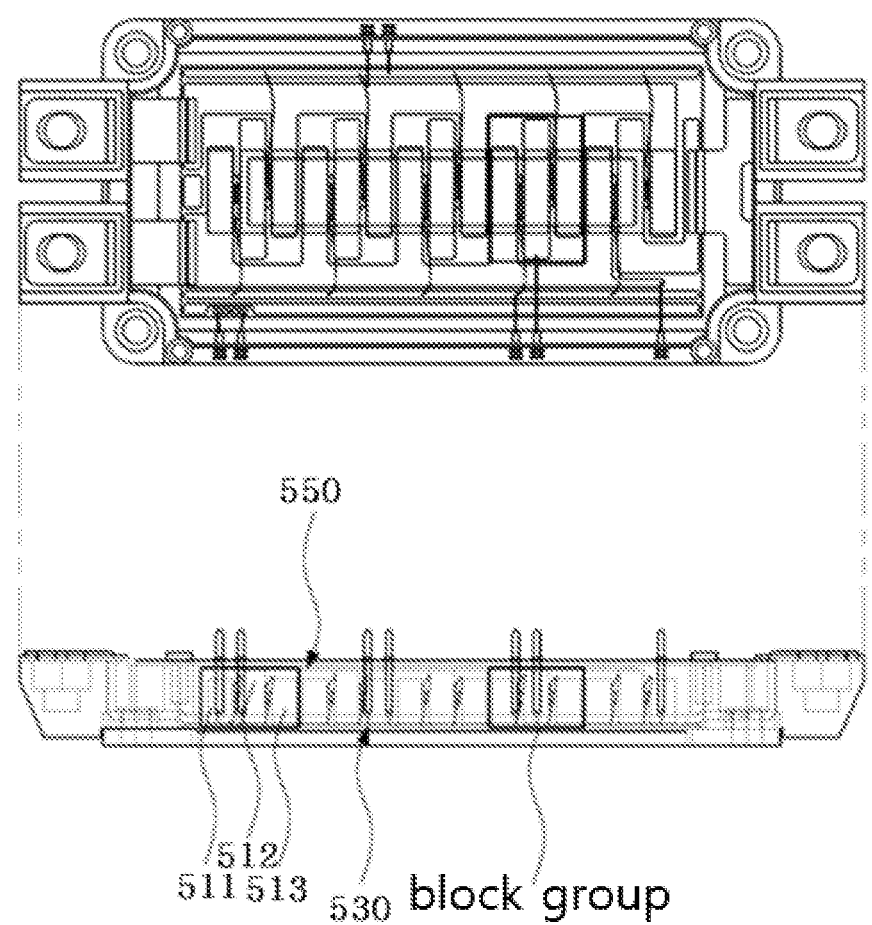

That is, as illustrated in FIG. 24, the first main block 511, the second main block 512, and the spacer 513 are formed as one block group. At least one block group is interposed between the first pattern substrate 530 and the second pattern substrate 550, is electrically connected to the first pattern substrate 530 and the second pattern substrate 550, and is arranged in series. Accordingly, an accumulation rate of a semiconductor chip may increase due to a vertically attached structure of the main block 510 interposed between the first pattern substrate 530 and the second pattern substrate 550 and a heat emission area is enlarged to improve a heat emission effect.

In addition, although not illustrated, a cooling pipe passing through the sides of the first main block 511, the second main block 512, or the spacer 513 and extending to an external circulator is used to circulate a coolant such as air, nitrogen, or cooling water and thereby, heat generated from the semiconductor chips 520 may be reduced.

A method of manufacturing a semiconductor package according to another embodiment of the present invention may include preparing the main block 510 for attaching one or more semiconductor chips 520, attaching the semiconductor chips 520 to one side of the main block 510, preparing the first pattern substrate 530 including a pattern enabling an electrical connection, vertically attaching and electrically connecting the other side of the main block 510 to the first pattern substrate 530, and forming the package body 540 which surrounds the main block 510 and the semiconductor chips 520. Accordingly, an accumulation rate increases due to a vertically attached structure of a semiconductor chip, a heat emission area is enlarged to improve a heat emission effect, and a semiconductor chip is directly connected to an external terminal, and thus, a compact semiconductor package may be manufactured.

The method of manufacturing a semiconductor package according to another embodiment of the present invention above will be described in more detail as follows.

Firstly, the main block 510 for attaching one or more semiconductor chips 520 is prepared and the semiconductor chips 520 are attached to one side of the main block 510.

For example, the semiconductor chips 520 may be attached to the upper surface of the main block 510 by using the conductive adhesive 521 interposed between the semiconductor chips 520 and the main block 510. As another embodiment of the present invention, the semiconductor chips 520 may include a power diode and a power DVC (IGBT, MOSFET, or GaN), wherein the power diode and the power DVC are electrically connected to each other by using a metal clip 522.

The main block 510 provides installation spaces for attaching the semiconductor chips 520, wherein the semiconductor chips 520 are attached on the patterns 531 and 532 formed on the first pattern substrate 530 by ultrasonic welding, soldering, or sintering and are thereby, electrically connected to the first pattern substrate 530.

Here, the main block 510 may be formed of a conductive material or formed by plating a conductive metal on a surface of a non-conductive material.

As another embodiment of the present invention, the main block 510 may be formed of a conductive material including copper (Cu) or aluminum (Al) and if needed, may be additionally plated with a conductive metal on a surface thereof. Also, the main block 510 may be formed by plating a conductive metal on a surface of a non-conductive material such as ceramic or aluminum silicon carbide (AlSiC).

As illustrated in FIGS. 18, 20, and 21, the main block 510 includes the first main block 511 and the second main block 512, wherein a lower side surface of the first main block 511 is attached on the first pattern 531 of the first pattern substrate 530 and a lower side surface of the second main block 512 is attached on the second pattern 532 of the first pattern substrate 530. Here, the first main block 511 and the second main block 512 may have the same vertical height or different vertical heights so as to be attached on the first pattern substrate 530 at each different vertical height.

Also, at least one semiconductor chips 520 are attached to one surface of the main block 510. Referring to FIG. 22, one or more semiconductor chips 520 are attached on the upper surface of the main block 510 and a lower surface or a side of the main block 510, on which the semiconductor chips 520 are not attached, may be vertically attached and electrically connected to the first pattern substrate 530.

Here, the semiconductor chips 520 may be formed of a power diode and a power DVC (IGBT, MOSFET, or GaN) and may include a solder base or a sintering material such as Ag or Cu.

In addition, the semiconductor chip 520 attached to one surface of the main block 510 may be directly connected to the first pattern substrate 530 by using an electrical connecting member.

That is, referring to FIGS. 23A and 23B, the electrical connecting member may be the conductive wire 523 connected to the third pattern 533 of the first pattern substrate 530 or a metal clip, and the semiconductor chip 520 may be electrically connected to the first pattern substrate 530 through the terminal pin 524 electrically connected to the third pattern 533.

Although not illustrated, the semiconductor chips 520 and the first pattern substrate 530 may include a conductive medium including a separate conductive metal, or a sub block interposed therebetween and may be electrically connected to each other.

That is, according to a package structure, the semiconductor chips 520 may be directly attached to the third pattern 533 of the first pattern substrate 530 by using an electrical connecting member and may be electrically connected to the third pattern 533 of the first pattern substrate 530. Also, the semiconductor chips 520 may be indirectly attached to the third pattern 533 of the first pattern substrate 530 by using a conductive medium or a sub block and may be electrically connected to the third pattern 533 of the first pattern substrate 530. Here, an insulator may be interposed between the conductive medium or the sub block and the main block 510 so that the conductive medium or the sub block may be attached to the main block 510.

Next, the first pattern substrate 530 including a pattern enabling an electrical connection is prepared, and the other side of the main block 510 is vertically attached and electrically connected to the first pattern substrate 530.

A pattern enabling an electrical connection is formed on the first pattern substrate 530. Referring to FIGS. 20 and 21, the first main block 511 is attached and electrically connected to the first pattern 531 of the first pattern substrate 530 and the second main block 512 is attached and electrically connected to the second pattern 532 of the first pattern substrate 530.

The first pattern substrate 530 may have a structure formed by stacking one or more metal layers and one or more insulation layers in order, wherein the structure may include a first metal layer, an insulation layer, and a second metal layer stacked in order.

Here, the insulation layer may include at least any one selected from ceramic (Al$_2$O$_3$), aluminum nitride (AlN), and silicon nitride (Si$_3$N$_4$).

Then, the package body 540 surrounding the main block 510 and the semiconductor chips 520 is formed.

The package body 540 surrounds and protects the main block 510 and the semiconductor chips 520. Referring to FIGS. 20 and 21, the package body 540 includes the first clip terminal 542 and the second clip terminal 543 penetrating the package body 540 at both sides thereof, wherein the first clip terminal 542 elastically presses the first pattern substrate 530, fixes the first pattern substrate 530 onto the base plate substrate 541, and applies an electrical signal to the first main block 511 through the first pattern 531, and the second clip terminal 543 applies an electrical signal to the second main block 512 through the second pattern 532.

Here, the first pattern substrate 530 may include a conductive or non-conductive adhesive (not illustrated) at the lower part thereof and may be attached on the base plate substrate 541.

In addition, the base plate substrate 541 may be formed of a conductive material or a non-conductive material.

A second pattern substrate 550 is formed on the upper part of the main block 510 and includes a pattern enabling an electrical connection thereon. The upper side surface and the lower side surface of the main block 510, where one or more semiconductor chips 520 are attached on the upper parts thereof, are each interposed between the first pattern substrate 530 and the second pattern substrate 550 and vertically attached to the first pattern substrate 530 and the second pattern substrate 550. Accordingly, the upper side surface and the lower side surface of the main block 510 may be electrically connected to the first pattern substrate 530 and the second pattern substrate 550.

According to another embodiment of the present invention, as illustrated in FIGS. 18 and 19, sides of the first main block 511 and the second main block 512, where the semiconductor chips 520 are not attached, stand vertically and are attached between the first pattern substrate 530 and the second pattern substrate 550. Here, the first main block 511 and the second main block 512 are formed to have different vertical heights. Accordingly, the first main block 511 is attached on the first pattern 531 of the first pattern substrate 530 and is electrically connected to the first clip terminal 542. The second main block 512 is attached on the second pattern 532 of the first pattern substrate 530, thereby closely adhered to the second pattern substrate 550, and is electrically connected to the second pattern substrate 550 through the second clip terminal 543.

Here, the spacer 513 is interposed between the first main block 511 and the second main block 512. Then, the first main block 511, the second main block 512 and the spacer 513 may be arranged vertically in series between the first pattern substrate 530 and the second pattern substrate 550. The second pattern substrate 550 is formed on the upper parts of the second main blocks 512 as a single substrate and is electrically connected to the second main blocks 512. Also, the second pattern substrate 550 may be formed on the upper parts of the second main blocks 512 as a plurality of cut substrates so that the plurality of cut second pattern substrates 550 may each cross and electrically connect the second main blocks 512.

That is, as illustrated in FIG. 24, the first main block 511, the second main block 512, and the spacer 513 are formed as one block group. At least one block group is interposed between the first pattern substrate 530 and the second pattern substrate 550, is electrically connected to the first pattern substrate 530 and the second pattern substrate 550, and is arranged in series. Accordingly, an accumulation rate of a semiconductor chip may increase due to a vertically attached structure of the main block 510 interposed between the first pattern substrate 530 and the second pattern substrate 550 and a heat emission area is enlarged to improve a heat emission effect.

In addition, although not illustrated, a cooling pipe passing through the sides of the first main block 511, the second main block 512, or the spacer 513 and extending to an external circulator is formed. Thus, the cooling pipe is used to circulate a coolant such as air, nitrogen, or cooling water and thereby, heat generated from the semiconductor chips 520 may be reduced.

Therefore, according to the semiconductor package described above, an accumulation rate of a semiconductor chip may increase due to a vertically attached structure of a semiconductor chip through a main block on a substrate, a heat emission area is enlarged to improve a heat emission effect, a semiconductor chip attached to a main block is directly and electrically connected to an external terminal, and thereby, a compact semiconductor package may be manufactured.

Also, semiconductor chips are vertically arranged between a first pattern substrate and a second pattern substrate formed at top and bottom and thus, a heat emission area is expanded to improve a cooling effect.

In addition, a cooling pipe passing through the sides of a main block, to which a semiconductor chip is attached, or a spacer and extending to an external circulator is used to circulate a coolant and thereby, heat generated from a semiconductor chip may be reduced.

According to the present invention, an accumulation rate increases on a substrate due to a vertically arranged structure of a semiconductor chip and a heat emission area is enlarged to improve a heat emission effect.

Also, a cooling pipe passing through a block is included so that an accumulation rate increases on a substrate due to a vertically arranged structure of a semiconductor chip, a heat emission area is enlarged to improve a heat emission effect, and a coolant circulates to reduce heat generated from a semiconductor.

In addition, semiconductor chips are vertically arranged between an upper substrate and a lower substrate so that a heat emission area is expanded to improve a cooling effect.

Moreover, an accumulation rate of a semiconductor chip increases due to a vertically attached structure of a semiconductor chip through a main block on a substrate and a heat emission area is enlarged to improve a heat emission effect of a semiconductor chip.

Furthermore, a semiconductor chip attached to a main block is directly and electrically connected to an external terminal and thus, a compact semiconductor package may be formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package which is modularized and manufactured by methods comprising:
    preparing a main block for putting on a semiconductor chip, an insulator, and one or more sub block;
    preparing the semiconductor chip;
    preparing an adhesive used in attaching the semiconductor chip;
    attaching the semiconductor chip to an upper surface or upper and lower surfaces of the main block;
    performing an electrical connection of the semiconductor chip;
    preparing a substrate comprising a pattern enabling an electrical connection; and
    vertically attaching one side of the main block to the pattern of the substrate to enable an electrical connection,
    wherein the main block and the sub block comprise a conductive metal.

2. The semiconductor package of claim 1, wherein the adhesive comprises a solder base or a sintering material such as Ag or Cu.

3. The semiconductor package of claim 1, wherein the main block comprises at least one or more semiconductor chips attached on an upper surface or upper and lower surfaces thereof.

4. The semiconductor package of claim 3, wherein the semiconductor chips are in plural numbers and are electrically connected to each other by using a metal clip, and the semiconductor chips and the sub block are electrically connected to each other by using a conductive wire.

5. The semiconductor package of claim 1, wherein the substrate is formed of an insulating material and a metal pattern formed on the insulating material.

6. The semiconductor package of claim 1, wherein one side of the main block is vertically attached to the pattern of the substrate by using ultrasonic welding, soldering or sintering and is electrically connected to the pattern of the substrate.

7. The semiconductor package of claim 6, wherein the semiconductor chips comprise a power diode and a power DVC, the power diode and the power DVC are electrically connected to each other by using the metal clip, the power diode and the sub block are electrically connected to each other by using a conductive wire or a conductive metal so as to form a power block as a unit, and a group block comprising a first power block, a second power block, and a spacer block is vertically attached and electrically connected to the pattern of the substrate.

8. The semiconductor package of claim 7, wherein the sub block of the group block is electrically connected to the substrate by using a conductive wire or a conductive metal.

9. The semiconductor package of claim 8, wherein the group block and the substrate are further formed on a semiconductor package body, a terminal pin is formed to connect a conductive wire connected to the substrate, the terminal pin is vertically formed on the substrate or inserted into the semiconductor package body, and the terminal pin is electrically connected to the substrate by using a conductive wire or a conductive metal.

10. The semiconductor package of claim 9, further comprising a cooling pipe extending from the outside of the semiconductor package body to a hole of the main block so that a coolant circulates therethrough.

11. The semiconductor package of claim 9, further comprising a cooling pipe extending from the outside of the semiconductor package body to a hole of the spacer block so that a coolant circulates therethrough.

12. The semiconductor package of claim 1, further comprising another substrate electrically connected to the other side of the main block.

13. The semiconductor package of claim 12, wherein the substrate and the other substrate are formed by stacking one or more metal layers, an insulation layer, and one or more metal layers in order or by stacking one or more metal layers and the insulation layer in order.

14. The semiconductor package of claim 13, wherein the substrate and the other substrate are formed as a single metal layer having a thickness of 0.1 mm through 10 mm.

15. A semiconductor package comprising:
    a main block;
    one or more semiconductor chips attached to one side of the main block;
    a first pattern substrate comprising a pattern enabling an electrical connection, wherein the other side of the main block is vertically attached and electrically connected to the first pattern substrate;
    a package body surrounding the main block and the semiconductor chips; and,
    a second pattern substrate comprising a pattern enabling an electrical connection, wherein one or more semiconductor chips are attached on the upper surface of the main block, and the upper side surface and the lower side surface of the main block are vertically attached and electrically connected to the first pattern substrate and the second pattern substrate, respectively,
    wherein the main block comprises a first main block and a second main block, a lower side surface of the first main block being attached to the first pattern substrate and an upper side surface of the second main block being attached to the second pattern substrate, the first main block and the second main block have different vertical heights, and the first main block, the second main block, and a spacer interposed between the first main block and the second main block are arranged in series between the first pattern substrate and the second pattern substrate.

16. The semiconductor package of claim 15, wherein one or more semiconductor chips are attached on an upper surface of the main block, and a lower surface or a side of the main block is vertically attached and electrically connected to the first pattern substrate.

17. The semiconductor package of claim 15, wherein the semiconductor chips and the first pattern substrate are directly connected to each other by using an electrical connecting member or electrically connected to each other by using a conductive medium interposed therebetween.

18. A semiconductor package comprising:
a main block;
a sub block attached to a first side surface of the main block;
at least one semiconductor chip attached to an upper surface of the main block;
a substrate having a pattern enabling an electrical connection; and
a package body surrounding the main block and the at least one semiconductor chip,
wherein a second side surface of the main block is vertically attached to the pattern of the substrate to enable an electrical connection,
wherein the main block and the sub block comprise a conductive metal.

* * * * *